United States Patent
Piazza et al.

(10) Patent No.: US 7,791,432 B2
(45) Date of Patent: *Sep. 7, 2010

(54) CONTOUR-MODE PIEZOELECTRIC MICROMECHANICAL RESONATORS

(75) Inventors: Gianluca Piazza, Lodi (IT); Philip J. Stephanou, Berkeley, CA (US); Albert P. Pisano, Danville, CA (US)

(73) Assignee: The Regents of the University of California, Oakland, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 11/444,913

(22) Filed: May 31, 2006

(65) Prior Publication Data

US 2006/0290449 A1 Dec. 28, 2006

Related U.S. Application Data

(63) Continuation-in-part of application No. 11/145,552, filed on Jun. 2, 2005.

(51) Int. Cl.
*H03H 9/00* (2006.01)
*H03H 9/54* (2006.01)
(52) U.S. Cl. .................. 333/186; 333/189; 333/197
(58) Field of Classification Search ............. 333/186, 333/187, 189, 197; 310/321
See application file for complete search history.

(56) References Cited

U.S. PATENT DOCUMENTS

| | | | | |
|---|---|---|---|---|
| 5,648,746 | A * | 7/1997 | Kaida | 333/189 |
| 6,548,943 | B2 * | 4/2003 | Kaitila et al. | 310/364 |
| 6,714,102 | B2 | 3/2004 | Ruby et al. | |
| 6,909,221 | B2 * | 6/2005 | Ayazi et al. | 310/321 |
| 2006/0090328 | A1 * | 5/2006 | Kawashima | 29/594 |
| 2006/0290449 | A1 * | 12/2006 | Piazza et al. | 333/187 |

OTHER PUBLICATIONS

Aigner et al., "RF-Filters in Mobile Phone Applications", *The 12th International Conference on Solid State Sensors, Actuators and Microsystems*, Jun. 8-12, 2003, pp. 891-894.

Bircumshaw et al., "The Radial Bulk Annular Resonator: Towards a 50Ω RF MEMS Filter", *The 12th International Conference on Solid State Sensors, Actuators and Microsystems*, Jun. 8-12, 2003, pp. 875-878.

Humad et al., "High Frequency Micromechanical Piezo-On-Silicon Block Resonators", *IEEE International Solid-State Circuits Conference*, 2003, pp. 39.3.1-39.3.4.

(Continued)

*Primary Examiner*—Dean O Takaoka
(74) *Attorney, Agent, or Firm*—Townsend and Townsend and Crew LLP

(57) ABSTRACT

A contour mode micromechanical piezoelectric resonator. The resonator has a bottom electrode; a top electrode; and a piezoelectric layer disposed between the bottom electrode and the top electrode. The piezoelectric resonator has a planar surface with a cantilevered periphery, dimensioned to undergo in-plane lateral displacement at the periphery. The resonator also includes means for applying an alternating electric field across the thickness of the piezoelectric resonator. The electric field is configured to cause the resonator to have a contour mode in-plane lateral displacement that is substantially in the plane of the planar surface of the resonator, wherein the fundamental frequency for the displacement of the piezoelectric resonator is set in part lithographically by the planar dimension of the bottom electrode, the top electrode or the piezoelectric layer.

23 Claims, 13 Drawing Sheets

OTHER PUBLICATIONS

Li et al., "Micromechanical 'Hollow-Disk' Ring Resonators", *IEEE International Solid-State Circuits Conference*, 2004, pp. 821-824.

Piazza et al., "Dry-Released Post CMOS Compatible Contour Mode Aluminum Nitride Piezoelectric Micromechanical Resonators for VHF Applications",*MEMS2005*, Jan. 30-Feb. 3, 2005, pp. 37-40.

Piazza et al., "Low Motional Resistance Ring-Shaped Contour-Mode Aluminum Nitride Piezoelectric Micromechanical Resonators for UHF Applications", *IEEE International Solid-State Circuits Conference*, 2005, pp. 20-23.

Piazza et al., "Voltage-tunable piezoelectrically-transduced single-crystal silicon micromechanical resonators", *Sensors and Actuators*, 2004, pp. 71-78.

Ruby et al., "Ultra-Miniature High-Q Filters and Duplexers Using FBAR Technology", *IEEE International Solid-State Circuits Conference*, 2001, 3 pp.

Wang et al., "1.51-GHz Nanocrystalline Diamond Micromechanical Disk Resonator with Material-Mismatched Isolating Support", Gas/Surface Dynamics Section, Code 6174, *IEEE International Solid-State Circuits Conference*, 2004, pp. 641-644.

Piazza et al., "Single-Chip Multiple-Frequency Filters Based on Contour-Mode Aluminum Nitride Piezoelectric Micromechanical Resonators", *IEEE International Solid-State Circuits Conference* 4 pp., Jun. 5-9, 2005.

Piazza et al., "Two Port Stacked Contour-Mode Aluminum Nitride Piezoelectric Micromechanical Resonators", *IEEE International Solid-State Circuits Conference*, 4 pp., Sep. 11-14, 2005.

Stephanou et al., "800 MHZ Low Motional Resistance Contour-Extensional Aluminum Nitride Micromechanical Resonators", *Berkeley Sensor and Actuator Center*, UC Berkeley, 2 pp., Jun. 4-8, 2006.

\* cited by examiner

CONTOUR-MODE PIEZOELECTRIC MICROMECHANICAL RESONATORS

CROSS-REFERENCES TO RELATED APPLICATIONS

This application is a continuation-in-part of U.S. patent application Ser. No. 11/145,552, filed Jun. 2, 2005, the entire content of which is incorporated herein by reference.

STATEMENT AS TO RIGHTS TO INVENTIONS MADE UNDER FEDERALLY SPONSORED RESEARCH OR DEVELOPMENT

This invention was made with Government Support under Grant (Contract) No. NBCH1020005 awarded by DARPA MTO/CSAC. The Government has certain rights in the invention.

BACKGROUND OF THE INVENTION

The present invention relates to micromechanical resonators. In particular, the present invention is related to a new class of contour-mode piezoelectric micromechanical resonators that can be employed as building blocks in wireless communication components such as filters and oscillators.

Recent demand in wireless communication for miniaturized, low-power, low-cost, on-chip and high-Q resonators to be employed in front-end RF filters or as frequency references has focused research efforts towards the development of new vibrating micromechanical structures, capable of substituting existing off-chip, bulky resonator technologies. Some promising alternatives to currently adopted solutions (SAW or ceramic devices) have been demonstrated (e.g., see, Li et al., *IEEE MEMS,* 821-824 (2004); and Wang et al, *IEEE MEMS,* 641-644 (2004)) using in-plane, electrostatically-transduced, micromechanical resonators made of polysilicon or polydiamond. Although high quality factors have been reported at ultra high frequency range (UHF), the exhibited impedance values are too high for these resonators to be directly coupled to antennas in RF systems. Also, the high temperature fabrication steps involved with the deposition of the structural layers ultimately complicate the integration of these devices with state-of-the-art microelectronic components.

Film Bulk Acoustic Resonator (FBAR) technology (e.g., see, Aigner et al., *Transducers,* 891-894 (2003); and Ruby et al., *IEEE International Solid-State Circuits Conference,* 121-122) has proven itself as a valid solution to replace conventional RF filters, demonstrating relatively high quality factors (Q~2,500), and small (several $\Omega$) impedances. The fundamental frequency of these devices is set by the film thickness. This constitutes a major challenge to the manufacturing of FBARs. On one hand, in order to obtain reasonable yields, a thickness tolerance of 0.1% is needed. On the other hand, multiple frequency selective arrays of resonators cannot readily be fabricated on a single chip, due to fact that the frequency of vibration for the devices is set by the film thickness.

There is therefore a need for an improved resonator that does not suffer from the design disadvantages of currently available resonators.

BRIEF SUMMARY OF THE INVENTION

The present invention is directed towards a new class of contour-mode piezoelectric micromechanical resonators that can be employed as building blocks in wireless communication components such as filters and oscillators, and a method of making the same. The piezoelectric materials used for the fabrication of the micromechanical resonators includes, for example, aluminum nitride (AlN), zinc oxide (ZnO), aluminum gallium arsenide (AlGaAs), Gallium Nitride (GaN), quartz and other piezoelectric materials. Other piezoelectric materials can include zinc-sulfide, cadmium-sulfide, lithium tantalate, lithium niobate, and other members of the lead lanthanum zirconate titanate family, and combinations thereof. The use of contour modes, as opposed to FBAR technology which employs a thickness mode, enables the fabrication of arrays of microresonators with different frequencies on a single chip. In addition, the contour mode micromechanical resonators in accordance with the embodiments of the present invention can be operated in air without significant performance degradation thereby reducing related packaging costs. Low motional resistance and high quality factor are thus provided on the same chip while spanning a frequency range from MHz to GHz. The contour-mode piezoelectric micromechanical resonators in accordance with the embodiments of the present invention also enable the fine and coarse tuning of their center frequencies directly on-chip without the need for additional post-processing steps.

In one embodiment, the present invention provides a contour mode micromechanical piezoelectric resonator. The resonator has a bottom electrode; a top electrode; and a piezoelectric layer disposed between the bottom electrode and the top electrode. The piezoelectric resonator has a planar surface with a cantilevered periphery, dimensioned to undergo in-plane lateral displacement at the periphery. The resonator also includes means for applying an alternating electric field across the thickness of the piezoelectric resonator. The electric field is configured to cause the resonator to have a contour mode in-plane lateral displacement that is substantially in the plane of the planar surface of the resonator, wherein the fundamental frequency for the displacement of the piezoelectric resonator is set in part lithographically by the planar dimension of the bottom electrode, the top electrode or the piezoelectric layer.

In another aspect, the present invention provides a method of fabricating a contour mode micromechanical piezoelectric resonator body on a substrate. The method includes forming a patterned bottom electrode above the substrate; forming a piezoelectric layer above the bottom electrode; forming a patterned top electrode on top of the piezoelectric layer; forming an opening through the piezoelectric layer to the bottom electrode; and etching the resonator body away from the substrate.

For a further understanding of the nature and advantages of the invention, reference should be made to the following description taken in conjunction with the accompanying drawings.

DETAILED DESCRIPTION OF THE INVENTION

Overview

Figure 1:
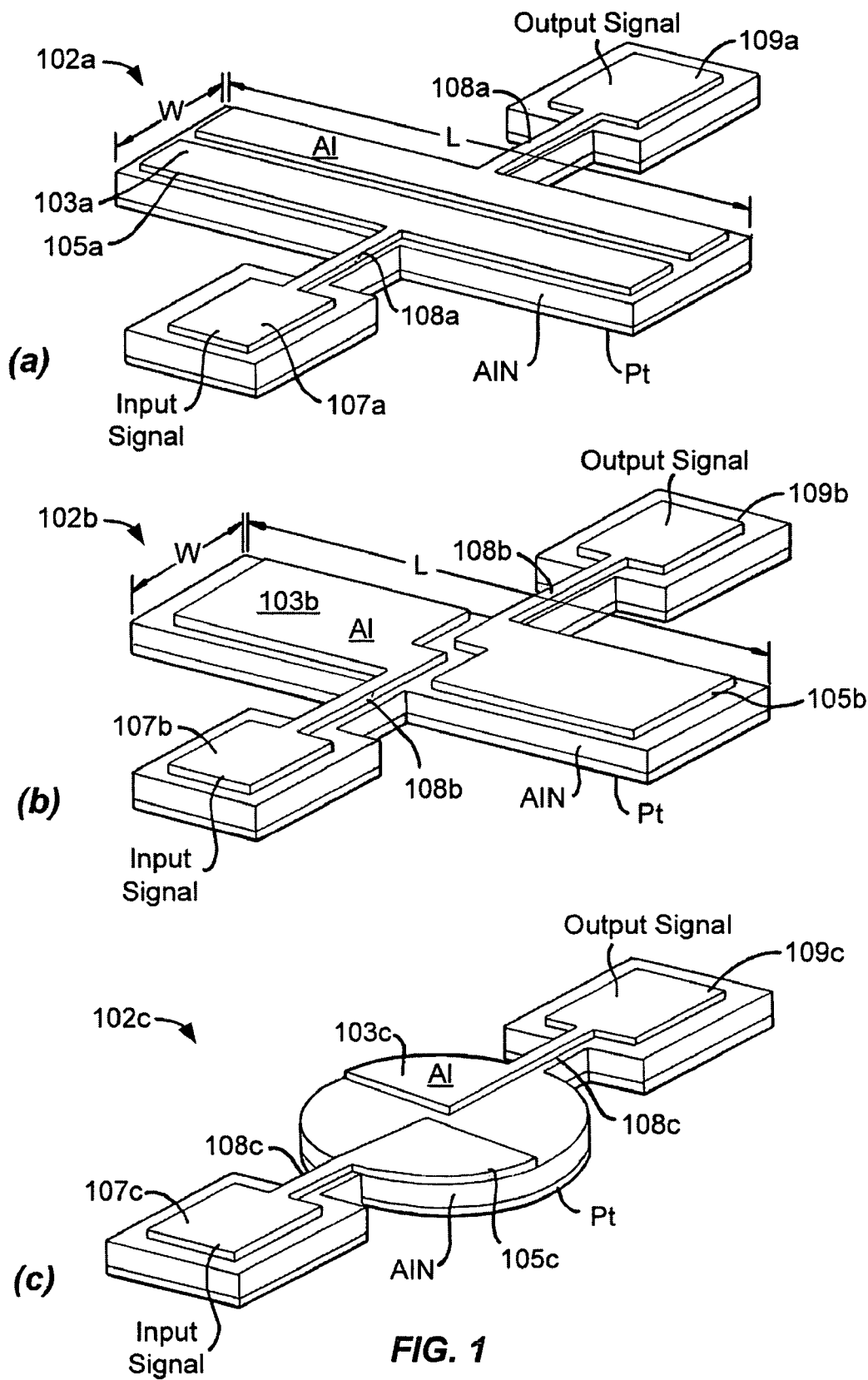
FIGS. 1(a)-(c) are exemplary diagrams of two rectangular-shaped and one disk-shaped micromechanical resonator configured for vibrating in a contour-mode, in accordance with one embodiment of the present invention.

The embodiments of the present invention are directed towards a new class of contour-mode piezoelectric micromechanical resonators that can be employed as building blocks in wireless communication components such as filters and oscillators, and methods for making the same. The micromechanical resonator includes a piezoelectric layer sandwiched between top and bottom electrodes, suspended in air and anchored in one or more locations. Exemplary devices were demonstrated using AlN as the piezoelectric layer. In addition, the piezoelectric materials that can be used for the fabrication of the micromechanical resonators include, for example, aluminum nitride (AlN), zinc oxide (ZnO), aluminum gallium arsenide (AlGaAs), Gallium Nitride (GaN), quartz and other piezoelectric materials. Other piezoelectric materials can include quartz, zinc-sulfide, cadmium-sulfide, lithium tantalate, lithium niobate, and other members of the lead lanthanum zirconate titanate family, and combinations thereof. The top or bottom electrodes may be made of various materials including platinum (Pt), aluminum (Al), molybdenum (Mo), tungsten (W), titanium (Ti), niobium (Nb), ruthenium (Ru), chromium (Cr), doped polycrystalline silicon, doped AlGaAs compounds, ruthenium, gold, niobium, copper, silver, tantalum, cobalt, nickel, palladium, silicon germanium, doped conductive zinc oxide (ZnO), and combinations thereof. An alternating current electric field applied across the top and bottom electrode induces mechanical deformations in the plane of the piezoelectric layer (contour mode) via the $d_{31}$ coefficient. At the device resonance frequency the electrical signal across the device is reinforced and the device behaves as an equivalent electronic resonant circuit (LC tank). The advantage of using a mechanical resonator is the high quality factor of such a structure and the consequent drastic reduction in its power dissipation. In addition, the devices in accordance with the embodiments of the present invention are extremely small (in general 100 μm×200 μm) and can be used as a frequency reference in oscillator circuits and in band pass filters for miniature radios, wristwatch, and cellular phones.

Contour-mode piezoelectric micromechanical resonators in accordance with the embodiments of the present invention have been demonstrated using AlN technology. In one example, a thin AlN layer (e.g., 0.5 to 2 μm thick) is sputter deposited on a patterned Pt bottom electrode. A low stress nitride layer is used as an insulating material between the bottom electrode and the silicon wafer. The insulating layer can be made from a material including silicon nitride, silicon dioxide, aluminum nitride, silicon carbide, titanium dioxide, polyimide dielectrics, hafnium dioxide, SU-8 photoresist, polymer dielectrics, and combinations thereof. A top aluminum electrode is patterned on top of the AlN in order to sandwich the piezoelectric material at the location where actuation is desired. The structures are released by dry etching of silicon in xenon difluoride ($XeF_2$), thereby eliminating stiction forces and significantly increasing yield. Alternatively, the structures can be released by a wet etching process. The fabrication steps occur at low temperature and offer the possibility to integrate the resonant devices with state-of-the-art microelectronic components. The patterning of the bottom electrode enables the on-chip coarse frequency tuning of contour-mode resonators. The acoustic impedance of Pt (significantly larger than the one of AlN and Al) loads the resonator and shifts its center frequency. This frequency change can be defined directly at the mask level without significant impact on the resonator performance. For example, two circular ring resonators having different electrode areas (coverage changes from 90% to 67.5% of the total resonator area) show a frequency shift of ~6.8% from 232 MHz to 249 MHz. A fine-tuning mechanism of the resonator center frequency has also been demonstrated by applying a DC bias voltage across the piezoelectric film. The center-frequency can be shifted either up or down by purely piezoelectric means. A tuning range of ~6 kHz was obtained for a 23 MHz rectangular plate using a 30 V power supply. The combined use of on-chip metal loading and DC biasing enables the efficient tuning of the resonant frequency of the piezoelectric devices without the need for post-processing step and ultimately reducing the fabrication cost of such devices.

Rectangular, diamond-shaped and circular plates, as well as circular and rectangular rings were successfully fabricated and operated. Contour-mode piezoelectric resonators were demonstrated to span a frequency range from 20 MHz to 1.15 GHz and can be extended up to 4 GHz. Quality factors of about 5,000 were obtained for rectangular plates excited in dilation-type contour modes at 23 MHz with motional resistance of 100Ω. Ring-shaped resonators, excited in width-extensional mode shapes, exhibited quality factors as high as 2,900 at a frequency of 473 MHz and a motional resistance of 80Ω.

Contour Modes in Plates

FIGS. 1(a) and 1(b) show schematic views of AlN rectangular plates vibrating in dilation-type contour modes. FIG. 1(a) shows a two-port, AlN rectangular plate resonator 102a with electrodes 103a, 105a placed parallel to the plate length, L, and having an input port 107a and an output port 107a. FIG. 1(b) shows a two-port, AlN rectangular plate resonator 102b with electrodes 102b, 105b placed parallel to the plate width, W, and having an input port 107b and an output port 109b. The resonators are shown to have a Pt bottom electrode and Al top electrodes. Disposed between the top and bottom electrodes is the AlN piezoelectric layer. A vertical electric field applied across the film thickness induces extensional mechanical stress in the plane of the film (through the $d_{31}$ piezoelectric coefficient) and excites the structures in a dilation-type contour mode. The two-port configurations were implemented by patterning the top electrodes symmetrically with respect to the length or the width of the plate. In order to minimize anchor losses, the resonators were suspended by two quarter-wavelength tethers 108a, and 108b.

Figure 2:
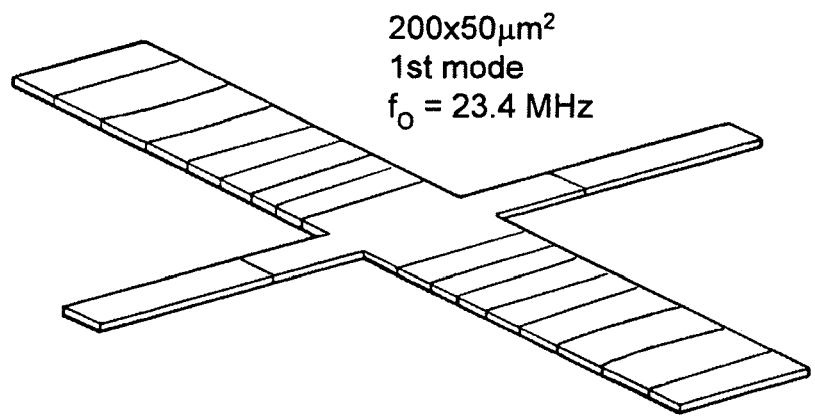
FIGS. 2(a)-(c) are exemplary diagrams showing in-plane contour mode shapes for a rectangular plate resonator, in accordance with one embodiment of the present invention.
Figure 2:
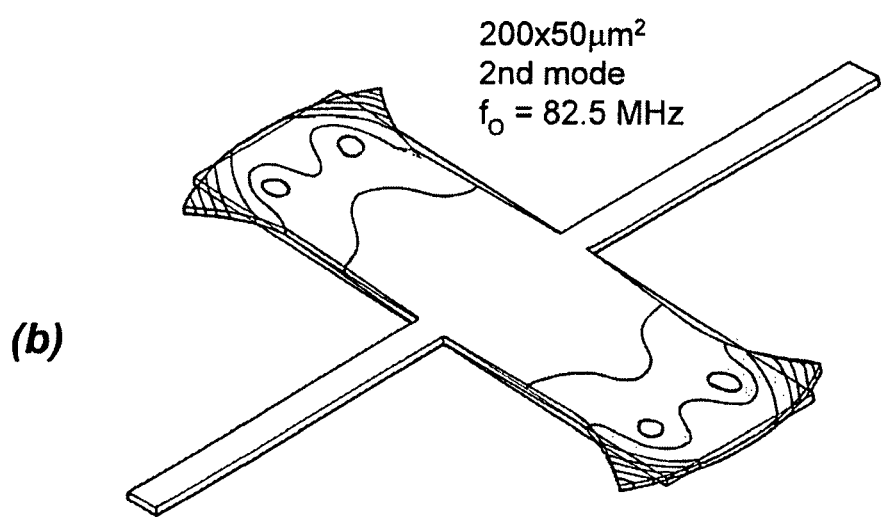
Figure 2:
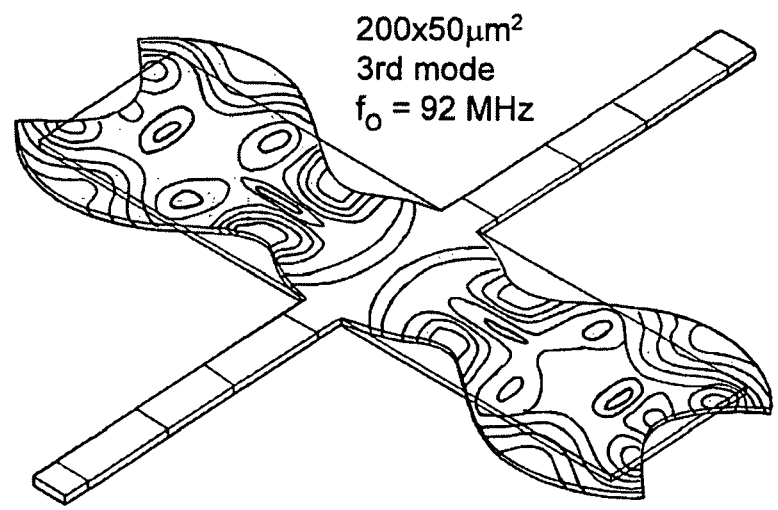
Figure 3:
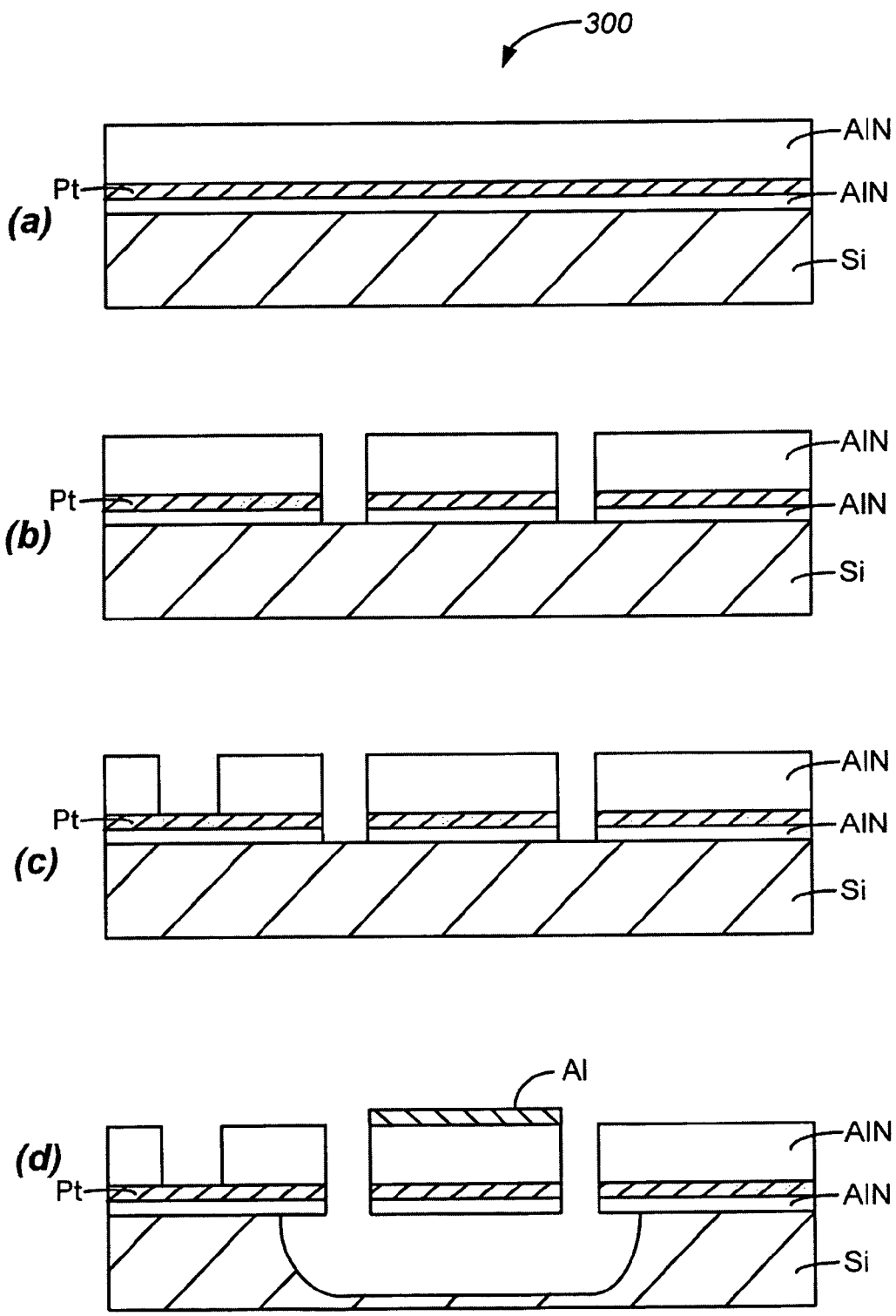
FIGS. 3(a)-(d) are exemplary diagrams of one embodiment of the fabrication process for the contour mode resonators in accordance with the embodiments of the present invention.

Several in-plane contour mode shapes can be excited in these resonators (e.g., see, Holland, *IEEE Transaction on Sonics and Ultrasonics*, Su-15(2): 97-105 (1968)), but either electrode configurations or energy loss mechanisms limit the detectable mode shapes to the ones shown in FIG. 2. FIG. 2 shows dilation-type contour modes (obtained via a finite elements analysis simulation) excited in a two-port AlN 200×50 μm resonator. FIG. 2(a) shows a fundamental length-extensional mode shape, also referred to as a first mode herein; FIG. 2(b) shows a first width-extensional mode shape, also referred to as second mode hereon; and FIG. 2(c) shows a second width-extensional mode showing effective quarter-wavelength tethers. As is shown in FIGS. 2(a)-(c), the application of an alternating electric field across the thickness of the piezoelectric resonator causes the resonator to have a contour mode in-plane lateral displacement that is substantially in the plane of the planar surface of the resonator.

The resonator can most effectively be excited in length-extensional (FIG. 2(a)) (e.g., see, Antkowiak et al., *Transducers*, 841-846 (2003)) and width-extensional (FIGS. 2(b)-(c)) dilation-type contour modes. A parameter that characterizes the relative strength of each of the resonances and sets the value of the equivalent motional resistance is the electromechanical coupling, $\eta_{em}$. Electromechanical coupling can either be defined as the ratio of the output force to the input voltage, or the ratio of the output charge to the mechanical displacement. For a symmetric electrode topology such as the one used in FIGS. 1a-b, $\eta_{in}$ $\eta_{out}$ are the same, specifically:

$$\eta_{em} = \frac{\iint_A (d_{31}T_{31} + d_{31}T_2)dA}{Z_{max}} = \frac{\frac{2E}{1-\sigma}d_{31}\iint_A \left(\frac{\partial u}{\partial x} + \frac{\partial v}{\partial y}\right)dA}{Z_{max}} \quad (1)$$

where $T_1$ and $T_2$ represent normal stresses in the x and y directions respectively, $d_{31}$ is the piezoelectric coefficient, u and v are the displacements in x and y directions (e.g., see, Johnson, *Mechanical Filters in Electronics*, New York, N.Y. Wiley (1983)), E is the Young's modulus, and σ the Poisson ratio for AlN, A is the electrode area, and $Z_{max}$ is the maximum displacement for the structure. Taking this into account the electrodes were placed so that $\eta_{em}$ is maximized.

Wineglass Contour Modes in Disks

FIG. 1(c) shows a schematic view of an AlN micromechanical disk configured to be excited in a wineglass contour mode. Due to the plane symmetry of AlN films, radial and compound mode shapes (e.g., see, Onoe, *The Journal of the Acoustical Society of America*, 28(6):1158-1162 (1954)) can be effectively excited in thin circular disks through the $d_{31}$ piezoelectric coefficient. In order to minimize anchor losses, the disk was pinned at two of its quasi-nodal points. FIG. 1(c) shows a two-port, AlN disk-shaped resonator 102c with electrodes 103c, 105c placed as diagonally opposing quadrants, and having an input port 107c and an output port 109c.

A two-port configuration is implemented by having each of the two top electrodes 103c and 105c cover a quadrant of the disk. By placing the electrode in such a fashion, maximum electromechanical coupling is achieved. In this specific case $\eta_{em}$ is given by:

$$\eta_{em} = \frac{\frac{2E}{(1-\sigma^2)}d_{31}\iint_A \left[\left(\frac{\partial u}{\partial v} + \sigma\frac{u}{r} + \frac{1}{r}\frac{\partial v}{\partial r}\right)\right]dA}{Z_{max}} \quad (2)$$

where E, σ, A and $Z_{max}$ are the same as defined in equation (1), u and v represent the radial and tangential displacements (e.g., see, Onoe, The *Journal of the Acoustical Society of America*, 28(6):1158-1162 (1954)), respectively, and r is the radial coordinate for the circular plate. Due to the isovoluminal nature of the mode shape and the electrode covering just half of the plate top surface, the electromechanical coupling for the disk is relatively smaller (~8×) than that for AlN plates of comparable frequency. The resonator of FIG. 1(c) has been shown to be excited in a wineglass contour mode shape.

Fabrication Process

Figure 4:
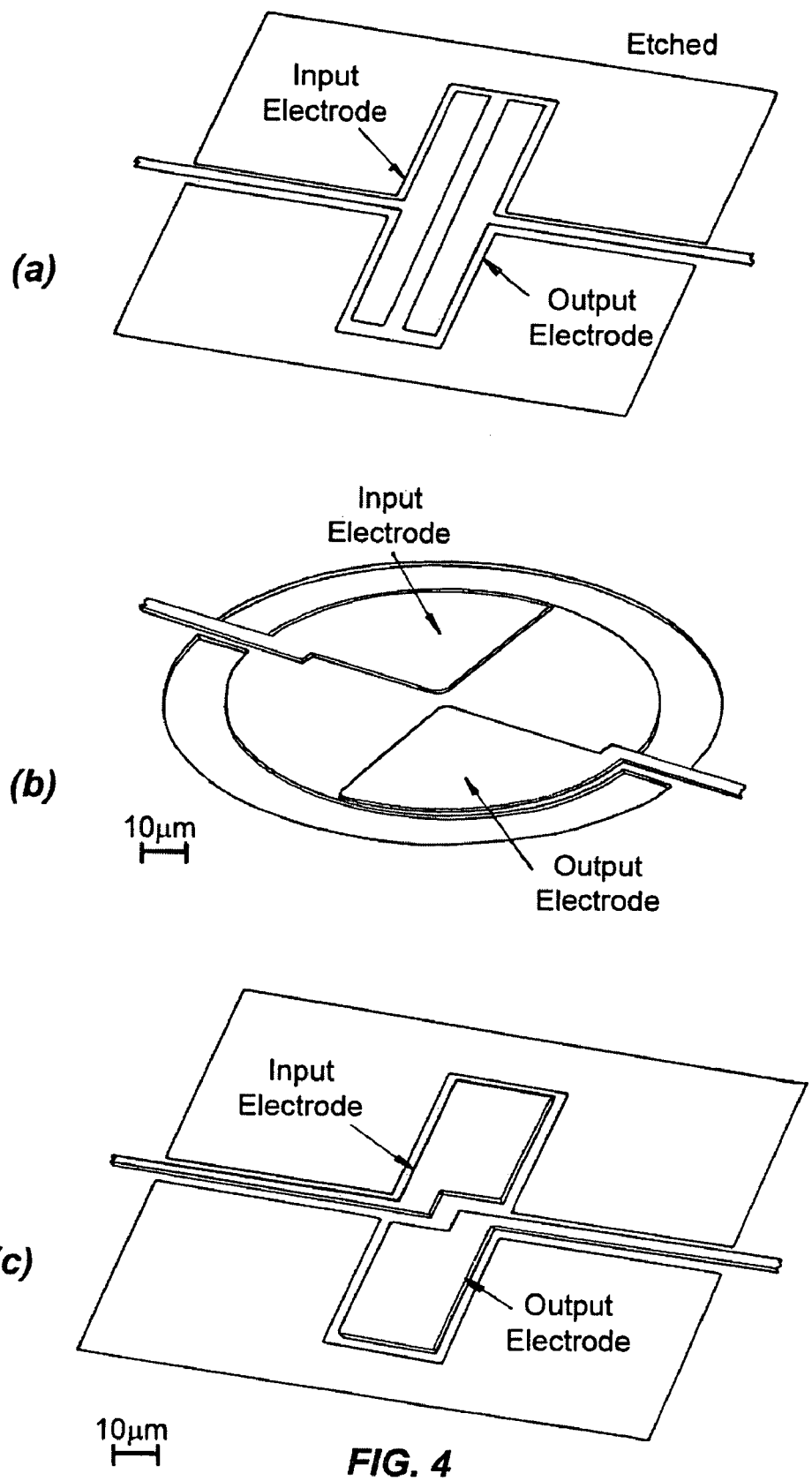
FIGS. 4(a)-(c) are SEM images showing two rectangular-shaped and one disk-shaped micromechanical resonator produced in accordance with the fabrication processes of FIGS. 3(a)-(d).

FIGS. 3(a)-(d) are exemplary diagrams of one embodiment of the fabrication process 300 for the contour mode resonators in accordance with the present invention. Briefly, in step (a), a thin layer of AlN, a layer of Pt, and AlN film are deposited on a Si substrate. In step (b), trenches are opened through the AlN layers and the Pt layer by a chlorine-based dry etching and ion milling, respectively. In step (c), openings to the bottom electrode are wet etched through the AlN layer in a hot (e.g., ~160° C.) phosphoric bath. In step (d), the Al top electrodes are evaporated and patterned by lift-off. Further details of the fabrication process are provided below. A three-mask, low-temperature (e.g., $T_{max}$<350° C.), post-CMOS compatible process was used to fabricate rectangular and circular AlN plates. A thin (~50 nm) AlN buffer layer was deposited on a Si wafer to provide electrical isolation. A 1.5 μm AlN film was sandwiched between a bottom platinum electrode and a top aluminum electrode. AlN is reactively deposited using an Advanced Modular Sputtering Inc., AMS 2003 sputtering tool. $Cl_2$-based dry etching was used to pattern AlN and yielded fairly straight (within 16° of vertical) sidewalls with an etch rate of ~80 nm/min. Oxide deposited by electron cyclotron resonance was used as a hard mask during the AlN etching step and the ion milling of the Pt layer. Openings to contact the bottom electrode were wet etched through AlN in a hot (e.g., ~160° C.) phosphoric bath. The top Al electrode is evaporated and patterned so that maximum electromechanical coupling is obtained. The structures are released by dry etching of silicon in $XeF_2$. Alternatively, the structures can be released by a wet etching process. This novel dry release step for fully AlN resonators eliminates stiction forces and significantly increases yield compared to other processes that use wet release techniques (e.g., see Humad et al., *IEDM*, 957-960 (2001)). The deposition steps occur at low temperature ($T_{max}$~350° C. when sputtering AlN) and thus can be integrated with state-of-the-art microelectronic components. FIG. 4 shows rectangular and circular plate resonators that were fabricated using the aforementioned process. FIG. 4(*a*) shows an 80×20 µm rectangular plate with electrodes parallel to the resonator length. FIG. 4*b* shows a 50 µm radius AlN circular plate configured for excitation in a wineglass mode shape, and FIG. 4(*c*) shows an 80×20 µm rectangular plate with electrodes parallel to the resonator width.

For the fabrication of the device, either of the bottom electrode, the piezoelectric layer and the top electrode or any other intermediate layers can be formed using an evaporation-based process, a sol-gel process, a chemical vapor deposition process, a metallo organic chemical vapor deposition process, a metallo oxide chemical vapor deposition process, and epitaxial process, an etching from bulk process, or combinations thereof.

Characterization—Plate and Disk Resonators

The fabricated micromechanical resonators, such as those shown in FIG. 4 above, were tested in a Janis micro-manipulated RF vacuum probe system in 5 mTorr vacuum and at atmospheric pressure. Ground-Signal-Ground (GSG) probes from Picoprobe were used. The bottom Pt electrode was grounded, whereas each of the two top electrodes was used for either sensing or driving the device under test. No interface circuitry between the resonator and the network analyzer was needed. Given the low impedance values, it was possible to directly measure the frequency response of the resonators using an Agilent 4195A network analyzer.

A. Frequency Response of AlN Rectangular Plates

Various rectangular plates with length to width ratios of 2 and 4 were fabricated and tested. The resonators varied in length from 80 to 200 µm. All resonators, despite their size and electrode configuration, exhibited the fundamental length-extensional mode. The response in vacuum of a 200×50 µm² plate, showed a Q of 3,280 and a motional resistance, $R_x$, of only ~150Ω when vibrating in its 1$^{st}$ mode (FIG. 2(*a*)). Higher order modes in plates were excited with electrodes placed parallel to the plate length and having a length to width ratio of 4. Q as high as 4,470 were obtained from the 2$^{nd}$ mode (FIG. 2(*b*)) of a 200×500 µm² plate at 80.57 MHz in vacuum. An 80×20 µm² plate achieved a measured frequency of 224.6 MHz with Q of 2,580 in vacuum, when vibrating in its 3$^{rd}$ mode (FIG. 2(*c*)). The use of quarter-wavelength tethers minimized the energy lost through the anchors and enabled achieving quality factors higher than the one recorded for the 1$^{st}$ mode. It should be noted that the resonators in accordance with the embodiments of the present invention were actuated in air without significant Q degradation. Recorded Q reduction was about 20-30% for all resonators. For example, Q of 2,000 in air and Q of 2,580 in vacuum were recorded for an 80×20 µm² plate vibrating in its 3$^{rd}$ mode. Other experimental measurements for dilation-type contour modes in AlN rectangular plates are summarized in a publication by the inventors herein (e.g., see, Piazza et al., "Dry-Released Post-CMOS Compatible Contour-Mode AlN Micromechanical Resonators for VHF Applications," *Hilton Head Workshop*, 38-41 (2004)). The recorded frequencies agreed to within 3% of those obtained by a finite element analysis.

A 200×50 µm² resonant plate exhibited a linear TCF over a temperature range of 28-100° C. TCF values of ~−26 ppm/° C., ~−25 ppm/° C., and ~−22 ppm/° C. were recorded for the same plate vibrating in its 1$^{st}$, 2$^{nd}$ and 3$^{rd}$ mode, respectively. Furthermore, the center-frequency of a plate was tuned both up and down by purely piezoelectric means. A constant strain was induced in the resonator by superimposing a DC voltage to the ac signal on the two top electrodes. This tuning mechanism resulted in a ±3 kHz linear tuning range for a 22.97 MHz rectangular plate using a 30 V power supply (slope ~4.4 ppm/V). Such a tuning scheme can be employed, for example, to implement low-power active frequency compensation for temperature variations of ±10° C.

B. Frequency Response of AlN Disks

50 µm radius AlN disks vibrating in a wineglass contour mode shape exhibited Q values as high as 5,830 at a frequency of 43.26 MHz in vacuum. A high quality factor of 3,700 was recorded in air for the same type of resonators. Using fairly small tethers (e.g., 5 µm wide) and anchoring the disk at its quasi-nodal points—since tangential displacement is non-zero at these locations—resulted in the highest Q for contour modes in AlN plates. Despite its high Q disk resonators show a motional resistance (~73 kΩ) much higher than the one recorded for rectangular plates. Although, having the electrodes over the whole resonator surface could decrease the motional resistance, the equivoluminal nature of the mode shape makes its excitation difficult in AlN films. The same resonator exhibited a linear TCF of ~−14 ppm/° C. for a temperature range of 28-100° C. While not being limited to a particular theory, the smaller value of TCF compared to the one recorded for rectangular plates may be a consequence of the isovoluminal mode shape.

Figure 5:
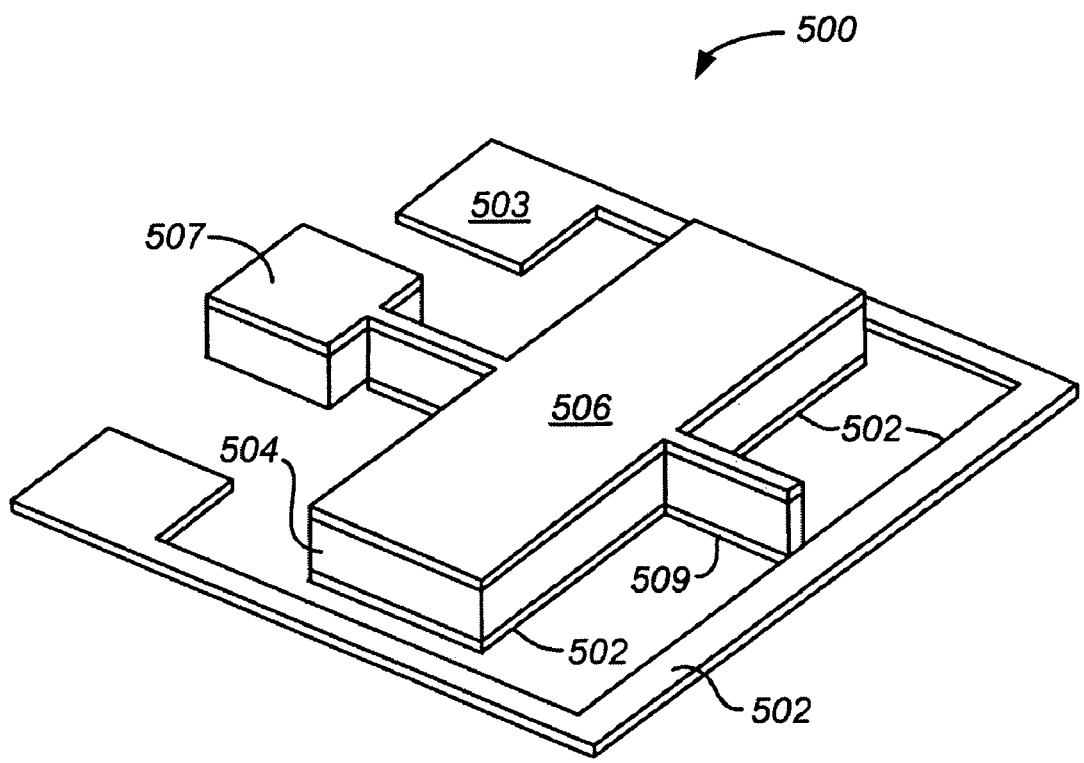
FIG. 5 is an exemplary diagram of another rectangular-shaped micromechanical resonator configured for vibrating in a contour-mode, in accordance with an alternate embodiment of the present invention.

FIG. 5 shows an alternative embodiment of a rectangular-shaped micromechanical resonator 500 configured for vibration in its contour-modes, in accordance with the embodiments of the present invention. The MEMS resonator 500 is shown to have a three-layer structure, where a layer of piezoelectric material 504 is located between a bottom electrode 502 and a top electrode 506. FIG. 5 also shows that a pad region on the bottom electrode 503 and a pad region on the top electrode 507 allow for the application of an alternating electric field across the thickness of the piezoelectric resonator 500, where the electric field is configured to cause the resonator to have a contour mode in-plane lateral displacement in the planar surface of the resonator. FIG. 5 shows the pad region 503 to be one two pads 503 that are located one on either side of the top pad 507. In the embodiment of FIG. 5, the pads 503, 507, that are used to apply an electric field across the thickness of the resonator 500, are located on the same side as of the resonator body. However, it should be noted that pads could be placed on different sides of the resonator body. The geometry of the piezoelectric layer 504, the geometry of the bottom electrode 502 and that of the top electrode 506 each in part contribute to the fundamental frequency of the excitation of the piezoelectric resonator. The geometries of the planar dimensions of the bottom electrode, the top electrode and the piezoelectric layer are patterned and set lithographically.

FIG. 5 shows that for one geometric configuration, the bottom electrode 502 surrounds the resonator's three-layer structure. The three-layer structure is connected with and supported by the bottom electrode 502 via tether 509. Other than at the tether 509, the three-layer stack has a free perimeter or periphery that enables the three layer stack to be excited in its contour-mode or lateral/extensional modes. The embodiment shown in FIG. 5 is one of several geometric configurations within the scope of the embodiments of the present invention, including the configurations of FIGS. 1(*a*)-(*c*), FIGS. 4(*a*)-(*c*), as well various other alternate embodiments described below, and variants and combinations thereof. It should be noted that the various alternative geometric configurations described herein are exemplary embodiments that show various possible configurations. The scope of the embodiments of the present invention is not limited solely to these exemplary configurations.

Ring-Shaped Resonators

Figure 6:
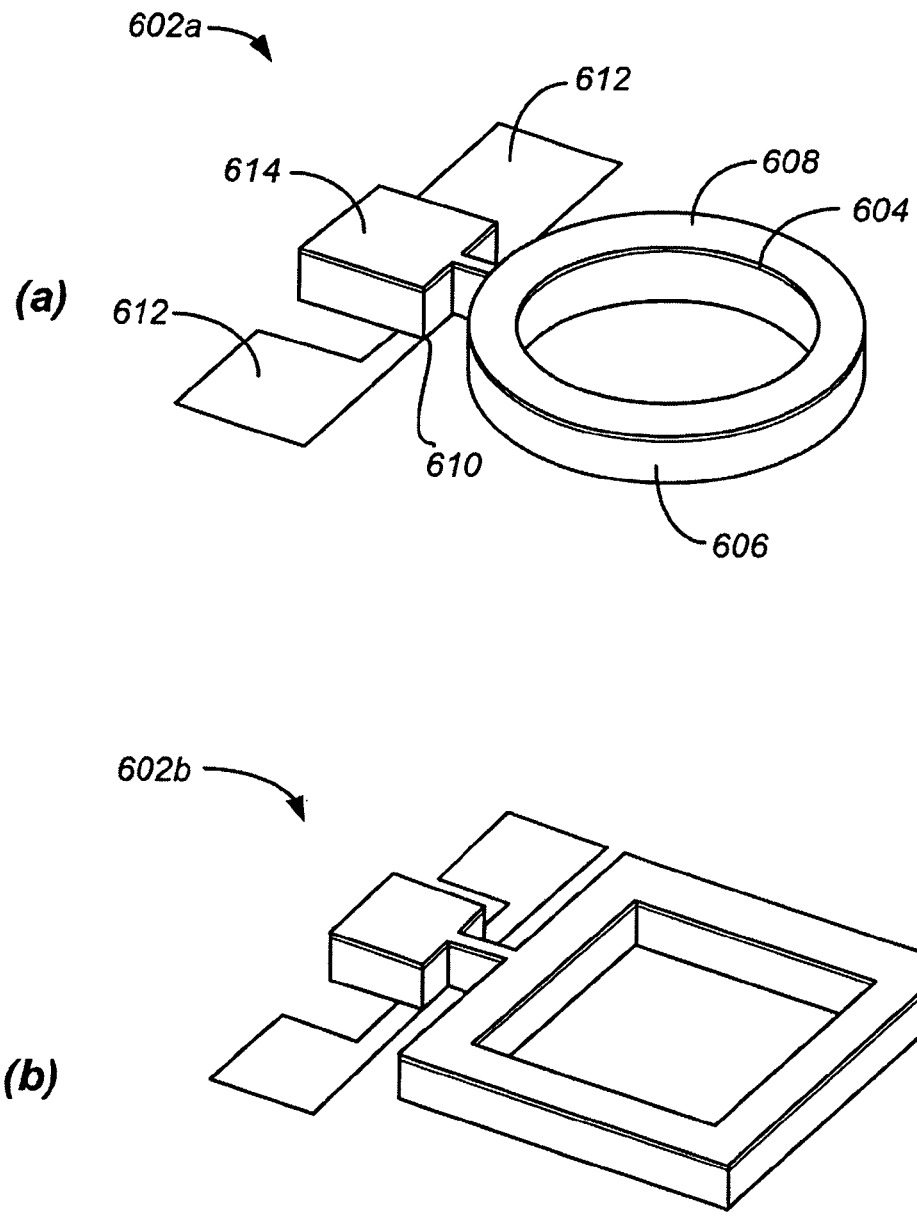
FIGS. 6(a)-(b) are exemplary diagrams of a circular ring-shaped (a) and a square-shaped ring (b) micromechanical resonator configured for vibrating in a contour-mode, in accordance with one embodiment of the present invention.

FIGS. 6(a)-(b) are exemplary diagrams of a circular ring-shaped (a) 602a and a square-shaped ring (b) 602b piezoelectric micromechanical resonator configured for vibrating in a contour-mode, in accordance with an alternative embodiment of the present invention. The resonator 602a has a three layer stack for a circular-ring 604 shaped resonator body. A layer of piezoelectric material 606 is located between a bottom electrode 610 and a top electrode 608. The bottom electrode includes pad regions 612 and the top electrode include pad region 614 that act as ground and input electrodes respectively. Also shown in FIG. 6(a) is that the three-layer ring-shaped structure 604 is connected with and supported by the electrodes via tether 616. Other than at the tether 616, the three-layer stack has a free perimeter or periphery that enables the three layer stack to be excited in its contour-mode or lateral/extensional modes. FIG. 6 shows a structure where a circular-shaped ring resonator (602a) is configured to be excited in a radial-extensional contour mode shape. FIG. 6 also shows an alternate structure where a square-shaped ring resonator (602b) is configured to be excited in a width-extensional contour mode shape. Other than a circular or a square-shaped-ring structure, other shapes may also be used, including rectangle, a polygon, a circular annulus, a rectangular annulus, a polygonal annulus and combinations thereof.

FIG. 6 shows a schematic view of exemplary circular and square ring-shaped resonators that were excited in radial and width-extensional contour mode shapes, respectively. For one example, the resonator body was made out of a layer of AlN sandwiched between bottom Pt and top Al electrodes. By applying an AC electric field across the film thickness, the active AlN piezoelectric layer undergoes (through the $d_{31}$ piezoelectric coefficient) an in-plane lateral displacement that is maximized at resonance. It is known that circular rings and, similarly, square rings vibrate in contour mode shapes whose fundamental frequency is set primarily by the width of the ring (e.g., see, Li. et al., *IEEE MEMS*, 821-824 (2004); Bircumshaw et al., *Transducers*, 875-878 (2003)).

Finite element analysis has shown that Al and especially Pt electrodes affect the resonator center frequency. Pt has a large mass density (6.5 times that of AlN); its mass loads the resonator and decreases its resonant frequency. Finite element modeling shows that this phenomenon can be exploited to lithographically vary the center frequency of the resonator without substantially altering its performance. This feature, namely the dimensions and the geometry of the electrodes, which is unique to contour-mode resonators, may be used to tune the center frequency of resonators, for example, when employed in ladder filter structures.

The asymmetry in the composition of the resonator's layers affects its purely in-plane motion by introducing some warping. While not being limited to any theory, one could argue that this phenomenon can ultimately degrade the quality factor and the transduction efficiency of the resonator by causing loss of the input energy in unwanted bending and charge cancellation. Accordingly, a symmetric design may in general be preferable.

Another unique feature of the ring-shaped resonator designs (e.g., see, Bircumshaw et al., *Transducers*, 875-878 (2003)) is the possibility to arbitrarily select the value of motional resistance via the choice of the lateral area of the ring. In analogy with length-extensional rectangular plates (e.g., see, Piazza et al., *MEMS*, 20-23 (2005)) the motional resistance, $R_x$, of the rings can be approximately expressed by (for $R_{ave} \gg W$):

$$R_x \approx \frac{\pi^2}{8} \frac{T}{2\pi R_{ave}} \frac{\sqrt{\rho}}{QE_P^{3/2} d_{31}^2} \quad (1)$$

where $R_{ave}$, T and W are the ring average radius, thickness and width; $\rho$ and $E_\rho$ are the mass density and modulus of elasticity of AlN. The same equation holds for a square ring where $2\pi R_{ave}$ is substituted by the average perimeter of the ring. Therefore, this design permits changes in $R_x$ by varying R or L (length of square ring) without affecting the resonator center frequency, and provides an extra degree of freedom to the circuit designer (e.g., in oscillators and pass-band filters design).

In order to minimize energy loss to the substrate quarter-wave supports were designed (e.g., see, Li et al., *IEEE MEMS*, 821-824 (2004)). Also in order to investigate losses due to anchoring, the same type of resonators were anchored by two quarter-wave, diametrically opposed, notched supports. Notching allows the anchors to be placed directly at the nodal line of the ring and therefore reduces the interference between the supports and the natural mode shape of the resonator (e.g., see, Li et al., *IEEE MEMS*, 821-824 (2004)).

FIGS. 7(a)-(d) are exemplary diagrams of an alternate embodiment of the fabrication process 700 for the contour mode resonators in accordance with the present invention. Briefly, in step (a) low stress nitride is deposited by a low pressure chemical vapor deposition process (LPCVD) onto a silicon substrate, followed by a bottom electrode (e.g., Pt) patterning by lift-off and the sputter deposition of the AlN piezoelectric layer. In step (b), the top electrode (e.g., Al) is deposited and patterned by dry etching in a chlorine environment ($Cl_2$). In step (c), via access to the bottom electrode is opened through the AlN layer, by wet etching using a hot (e.g., 160° C.) phosphoric acid ($H_3PO_4$) bath. In step (d), the resonant device is dry etched in $Cl_2$ and the structure is dry released in $XeF_2$. Alternatively, the structure can be released by a wet etching process. Further details of the fabrication process are provided below.

For some examples, a four-mask, post-CMOS compatible process (i.e., $T_{max}<400°$ C.), such as the one described above was used to fabricate the devices shown in FIG. 6 above. A 2 µm AlN film was sandwiched between a bottom platinum electrode and a top aluminum electrode. AlN films were sputter-deposited using a single-module AMS PVD sputtering tool. Highly crystalline films with rocking curve values below 2° were obtained. The fabrication includes the patterning of the bottom Pt electrode on a low stress nitride buffer layer in order to reduce parasitic capacitance and electrical losses. The top Al electrode was patterned by dry etching. $Cl_2$-based dry etching was used to pattern AlN and obtain fairly straight sidewalls (e.g., 16° from the vertical). During the dry etch process the AlN film was masked by oxide deposited either by electron cyclotron resonance or by low temperature chemical vapor deposition techniques ($T_{max}<400°$ C.). If LTO was used, the top Al electrode was protected by a thin (<30 nm) layer of Nb that was removed with the remaining oxide during a $CF_4$-based dry etch step. The structures were released by dry etching of silicon in $XeF_2$, thereby eliminating stiction forces and significantly increasing yield. Alternatively, the structures can be released by a wet etching process. As described above, the patterning of the bottom electrode enables the on-chip tuning of contour-mode resonators.

Figure 7:
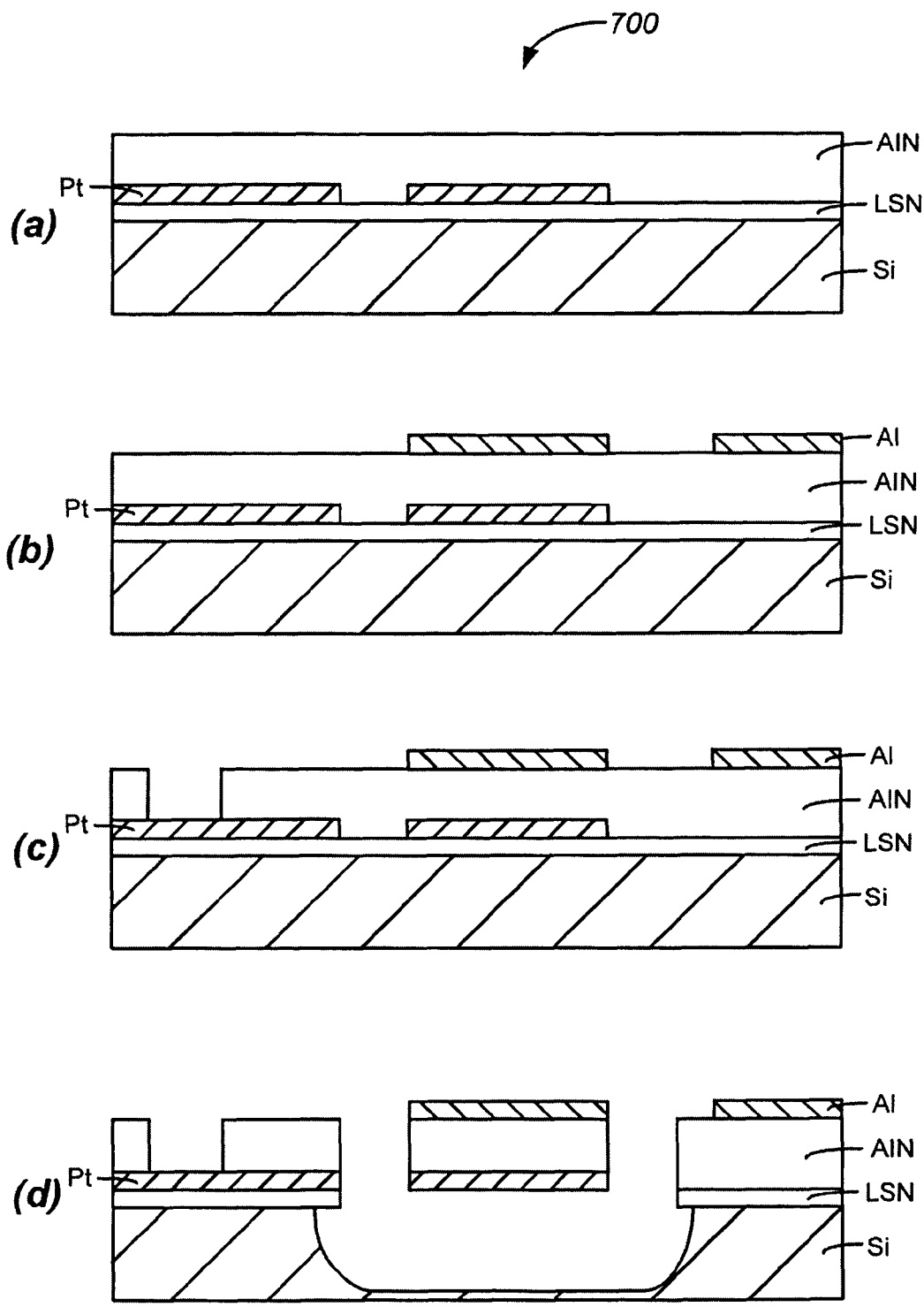
FIGS. 7(a)-(d) are exemplary diagrams of an alternate embodiment of the fabrication process for the contour mode resonators in accordance with the embodiments of the present invention.
Figure 8:
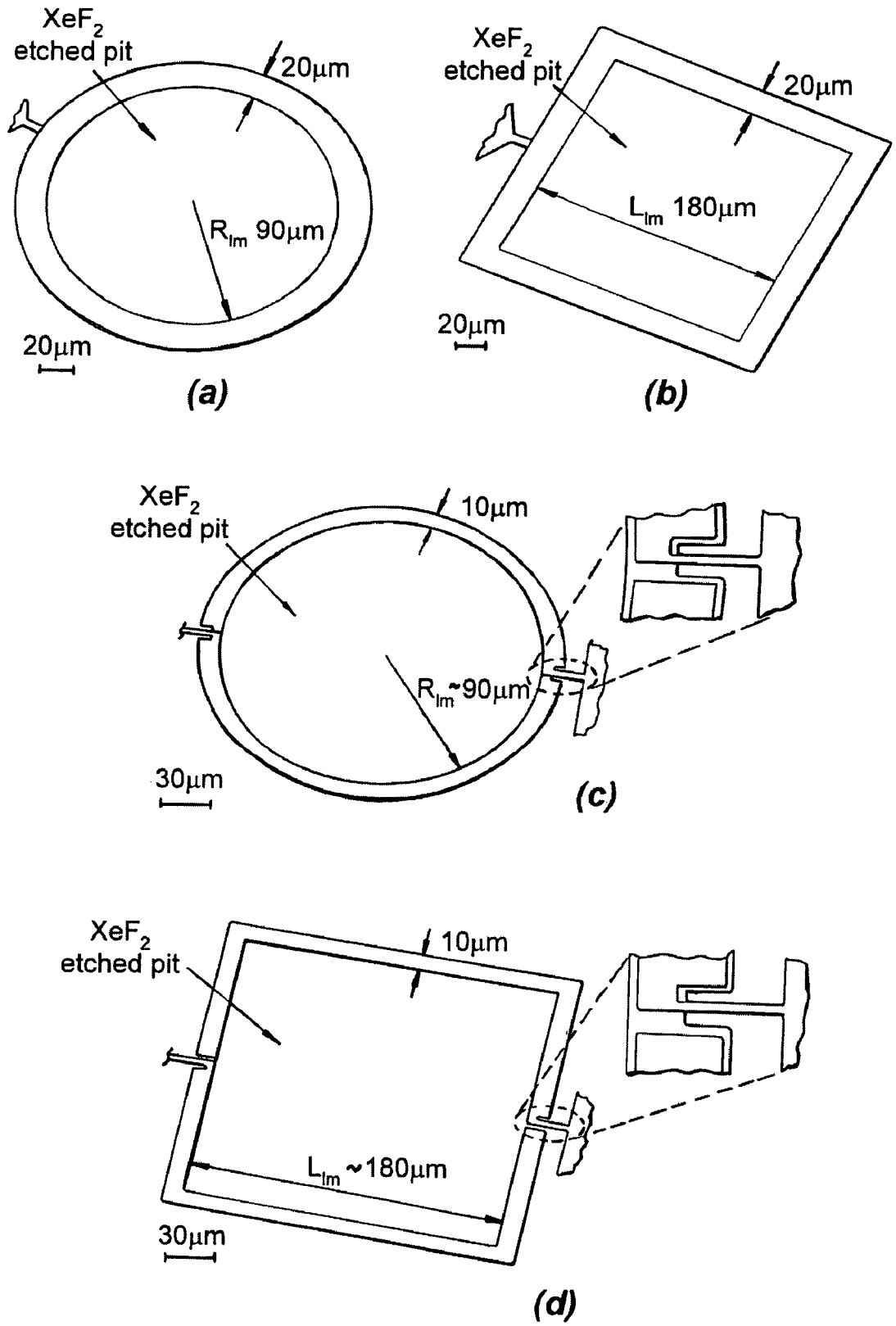
FIGS. 8(a)-(d) are SEM images showing a circular ring-shaped and a square-shaped ring micromechanical resonator produced in accordance with the fabrication processes of FIGS. 7(a)-(d).

FIGS. 8(a)-(d) are SEM images showing circular ring-shaped and square-shaped ring micromechanical resonators produced in accordance with the fabrication processes of Figs. FIGS. 7(a)-(d). FIG. 8(a) shows a SEM image of a single-supported circular-shaped contour-mode 20 µm wide ring resonator. FIG. 8(b) shows a SEM image of a single-supported square-shaped contour-mode 20 µm wide ring resonator. FIG. 8(c) shows a SEM image of a two-support circular-shaped contour-mode 10 µm wide resonator and a detail view of notched supports; and FIG. 8(d) shows a SEM image of a two-support square-shaped contour mode 10 µm wide resonator and a detailed view of notched support. FIGS. 8(c) and 8(d) show ring-shaped contour-mode resonators with notched supports. Notched supports were introduced in order to reduce anchor losses. Although the top Al electrodes of these notched resonators were patterned in such a way to permit a two-port configuration, these devices were successfully tested in a one-port configuration, for which fewer spurious modes were observed.

Experimental Results—Ring-Shaped Resonators

The fabricated micromechanical resonators, similar to those shown in FIGS. 8(a)-(d), were tested in a Janis micro-manipulated RF probe station at atmospheric pressure. Ground-Signal-Ground (GSG) probes from Picoprobe were used. $S_{11}$ parameters for each of the devices were extracted and converted into equivalent admittances using an Agilent E8358A network analyzer. One-port $S_{11}$ parameter calibration (SOL) was performed using short and open reference structures directly fabricated on the die under test, whereas a 50Ω resistor on a ceramic substrate was used as a load reference.

Frequency Response—Ring-Shaped Resonators

A typical response of a circular ring microresonator with a single un-notched support showed that it had a motional resistance as low as 56Ω with Q of 2,400 in air for a 223.9 MHz resonator.

A comparison of identical resonators showed that notched supports did not substantially improve the Q of the resonator, but they did reduce the interference between the anchors and the resonator motion, especially for resonators with smaller ring widths. Less mechanical interference translates into a cleaner electrical signal, with fewer spurious resonances. Other experimental results showed that a Q of 2,900 was obtained for a circular ring resonator at 472.7 MHz with notched supports, a width of 10 µm and inner radius of 90 µm. The motional resistance of this resonator was ~84Ω.

To further prove the less intrusive nature of notched supports, a 20 µm wide ring with 90 µm inner radius was excited in its $2^{nd}$ overtone reaching a frequency of 656.2 MHz with Q of 1,400 and $R_x$~170Ω.

The value of the motional resistance of the resonators is controllable by changing the size of the inner radius. A 20 µm wide circular ring with an inner radius of 40 µm exhibited a motional resistance of 204Ω at 227.4 MHz. This reduction in size affects the quality factor of the resonators such that the Q value was reduced to 1,100 from 1,400.

By changing the width of top and bottom electrodes (without changing the width of the AlN ring) the center frequency of these resonators may be tuned lithographically. For example, two circular ring resonators (20 µm wide and with 140 µm inner radius) having different electrode area (coverage changes from 65% to 95% of the total resonator area) show a frequency shift of ~6.8% from 232 MHz to 249 MHz. The frequency shift does not affect the strength of the signal because the majority of the strain is located close to the nodal lines; therefore, the strain is efficiently transduced. A TCF of approximately −25 ppm/° C. was recorded for the circular ring resonators.

Square-shaped micromechanical ring resonators were excited in width-extensional mode shapes. The typical response for a 10 µm wide resonator with inner ring length of 180 µm is shows that the resonators were able to reach a frequency as high as 475.3 MHz with respectable Q of 1,600 and $R_x$~130Ω. A TCF of approximately −25 ppm/° C. was recorded for the square-shaped micromechanical ring resonators. Additional experimental results are provided in Piazza et al., "Low Motional Resistance Ring-Shaped Contour-Mode AlN Piezoelectric Micromechanical Resonators for UHF Applications," *IEEE MEMS* 20-23 (2005).

EXAMPLES

Anchor Losses in Circular Rings

In order to study the effect of anchor losses on circular rings, un-notched tethers with three different widths (6, 10 and 20 µm) were fabricated. The size of the supports slightly affects the resonator center frequency, because of the increased stiffness, but no net change in Q was recorded. Resonators with two notched supports achieve Q factors as high as those obtained for devices with just a single un-notched support. The inventors herein believe that devices with a single notched support could provide a higher Q.

Band Pass Filter Circuits

The contour-mode rectangular plate and ring-shaped piezoelectric resonators described above may be used as the building blocks for the various circuit configurations such as, for example, multiple-frequency band pass filter and oscillator circuits. The embodiments of the present invention enable the formation of multiple-frequency, band pass filters on the same chip. FIG. 9(a) shows a ladder filter (e.g., L-network) configuration incorporating the contour-mode micromechanical resonators in accordance with the embodiments of the present invention (a). FIG. 9(b) shows a schematic representation of the electrical response of individual series and shunt resonators and a ladder filter of FIG. 9(a). The basic ladder filter configuration is composed of series and shunt resonators (FIG. 9(a)) to form an L network. Then these networks can be cascaded to form more complicated multi-pole filters. These networks have been analyzed using an ABCD matrix approach (e.g., see, Lakin. et. al., "Thin Film Bulk Acoustic Wave Filters for GPS," *Ultrasonic Symposium*, 471-476 (1992)). For an initial proof of concept, high order filters (3rd and 4th) were built by simply cascading L networks.

When designing band pass filters, it is desired to achieve a symmetrical group delay, low insertion losses and large out-of-band rejection. In order to provide a symmetrical group delay the filter termination, $R_{term}$, is chosen to be the geometric mean of the series and shunt resonator reactances (e.g., see, Lakin et. al., "Thin Film Bulk Acoustic Wave Filters for GPS," *Ultrasonic Symposium*, 471-476 (1992)), such that:

$$R_{term} = \frac{1}{\omega_C} \sqrt{\frac{1}{C_P C_S}} \quad (1)$$

where $\omega_c$ is the filter center frequency, and $C_P$ and $C_S$ are the parallel capacitance of the shunt and series resonators, respectively. Maximum $S_{21}$ is obtained when the parallel resonance of the shunt branch, $f_{PP}$, coincides with the series resonance of the series branch, $f_{SS}$. In this condition, the insertion losses can be expressed as:

$$I.L. \approx 1 - \frac{n}{\omega_C C_S R_{term} k_t^2 Q} \quad (2)$$

where n is the number of L networks, $k_t^2$ is the effective electromechanical coupling of AlN (e.g., see, Lakin et. al., "Thin Film Bulk Acoustic Wave Filters for GPS," *Ultrasonic Symposium,* 471-476 (1992)) and Q is the quality factor of the individual series resonators. In order to minimize losses, large $k_t^2$ and Q are desired. Out-of-band rejection is set by the capacitance ratio between the series and shunt branch and by the number of L stages, such that:

$$S_{21\_Out-of-Band} \approx \frac{1}{(1 + C_P/2C_S)^n} \quad (3)$$

The fractional bandwidth of the filter is set by the distance between the two zeros (the parallel resonance of the series branch, $f_{PS}$, and the series resonance of the shunt branch, $f_{SP}$, respectively) of the filter transfer function. Ultimately this translates into:

$$\frac{f_{PS} - f_{SP}}{f_c} \approx \frac{8}{\pi^2} k_t^2 \quad (3)$$

Therefore, the bandwidth of the filter depends on the electromechanical coupling coefficient and is theoretically limited to a maximum of ~2.5%, unless other external elements are used.

Amongst the principal parameters on which the designer can act are the values of the parallel capacitance of the series and shunt resonators as well as their ratio and the number of stages required. In order to minimize insertion losses and at the same time provide good out-of-band rejection, a maximum number of 3 or 4 stages are selected. The capacitance ratio is chosen so that good out-of-band rejection can be obtained while maintaining high-Q resonators (e.g., in Piazza et al., "Low Motional Resistance Ring-Shaped Contour-Mode AlN Piezoelectric Micromechanical Resonators for UHF Applications," *IEEE MEMS,* 20-23 (2005)). It was shown that Q degrades when the inner radius of the ring is made smaller. In the example filter circuits used herein capacitance ratios of 1 and 0.67 were used.

A four-mask, low-temperature, post-CMOS compatible ($T_{max}$<400° C.) process, such the process of FIGS. 7(*a*)-(*d*) was used to fabricate the filter devices. The process flow is substantially the process of FIG. 7(*a*)-(*d*), and used micromachining technique to manufacture high quality AlN resonators with high yield. For example, a single resonator has a 2 µm AlN film sandwiched between a bottom platinum electrode (~100 nm thick) and a top aluminum electrode (~175 nm thick). AlN films were sputter-deposited using an AMS PVD tool and exhibit rocking curve values as low as 1.3° on Pt seed layers. The difference with respect to the fabrication process described in FIGS. 7(*a*)-(*d*) involves performing the wet etch of AlN to access the bottom electrode before the deposition and patterning of the top Al electrode. This step is used to implement a ladder filter topology, for which contact between the top and bottom electrodes is required.

Figure 9:
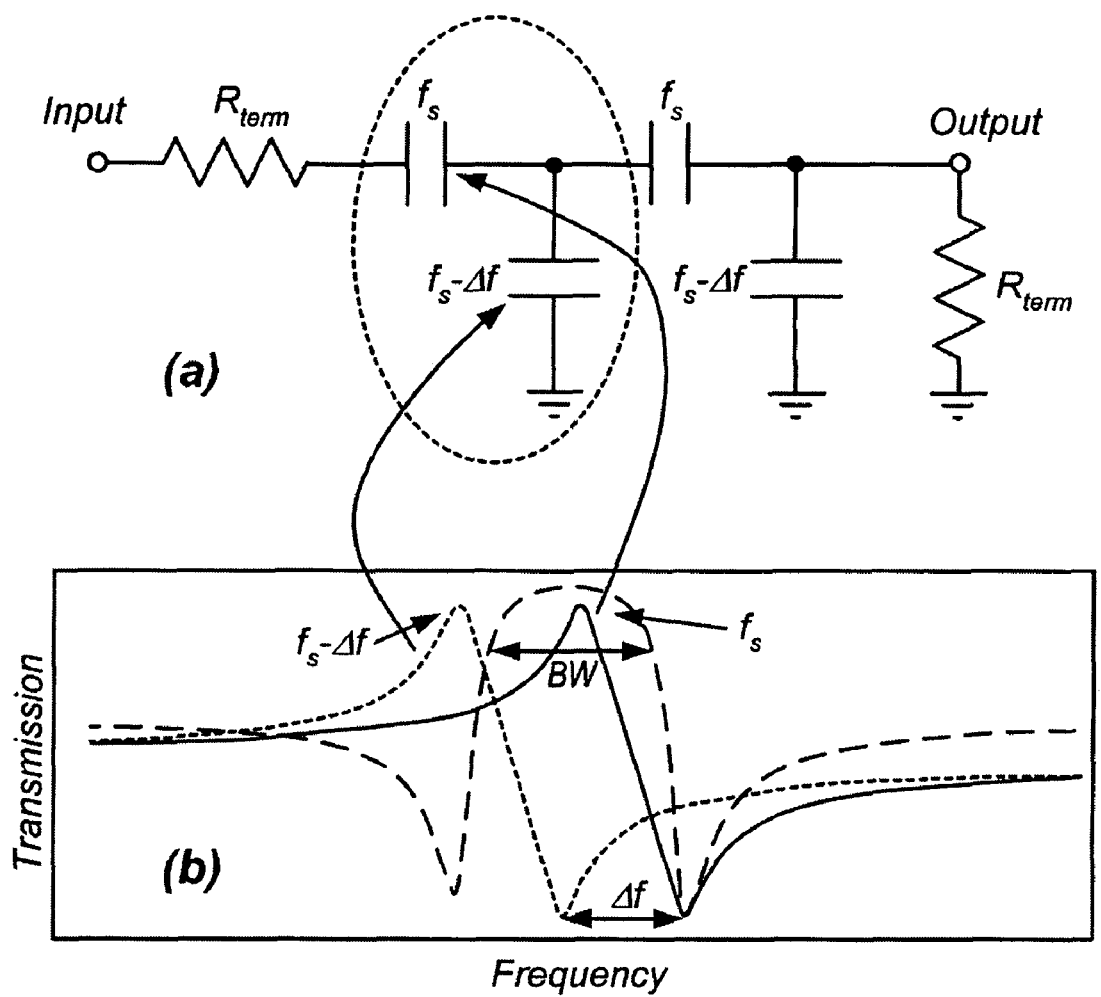
FIG. 9(a)-(b) show a ladder filter configuration incorporating the contour-mode micromechanical resonators in accordance with the embodiments of the present invention (a); and a schematic representation of the electrical response of individual series and shunt resonators and a ladder filter made of the same (b).

As it was shown in FIG. 9(*b*), the parallel resonance of the shunt brunch should coincide with the series resonance of the series branch for the filter to work properly. The shift can be defined directly during the processing step used for patterning the Pt electrode. The Pt electrode has a very large mass density, about 6.5 times the one of AlN. By removing small amounts of Pt the center frequency of the resonator may be raised. Being most of the strain (and consequently charge) and concentrated in the middle of structure, small amounts of Pt are lithographically removed from the edges of the microstructures (FIG. 10) without affecting the overall performance of the resonators. The loading mechanism was experimentally verified and may be explained by an analytical model based on vibration techniques (e.g., see, Graff, "Wave Motion in Elastic Solids," Dover Publications, Inc., New York). The experiments showed that for a 100 nm thick Pt the center frequency of a 90 µm inner radius ring structure shifts by ~7000 ppm for each µm of Pt that is removed from the width of the structure, rectangular plate shifts by 500 ppm for each µm of Pt that is removed from the length of the structure.

Figure 10:
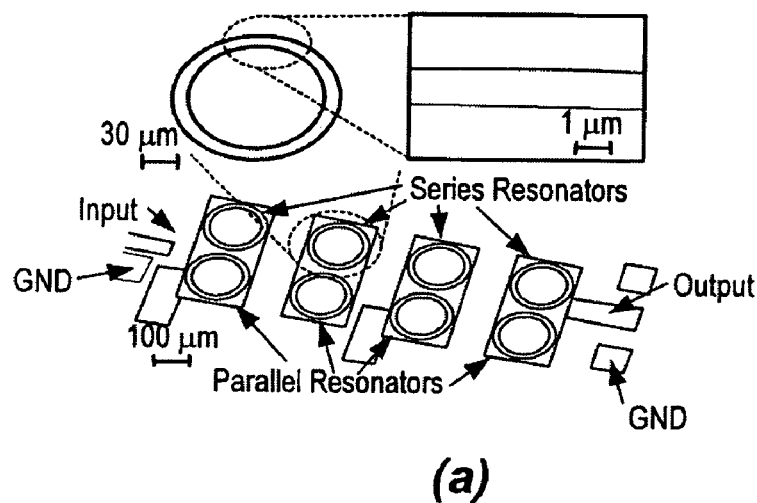
FIG. 10(a)-(b) are SEM images showing a ladder filter made using ring-shaped micromechanical resonators (a) in accordance with the embodiments of the present invention; and a ladder filter made using rectangular-shaped micromechanical resonators (b) in accordance with the embodiments of the present invention.
Figure 10:
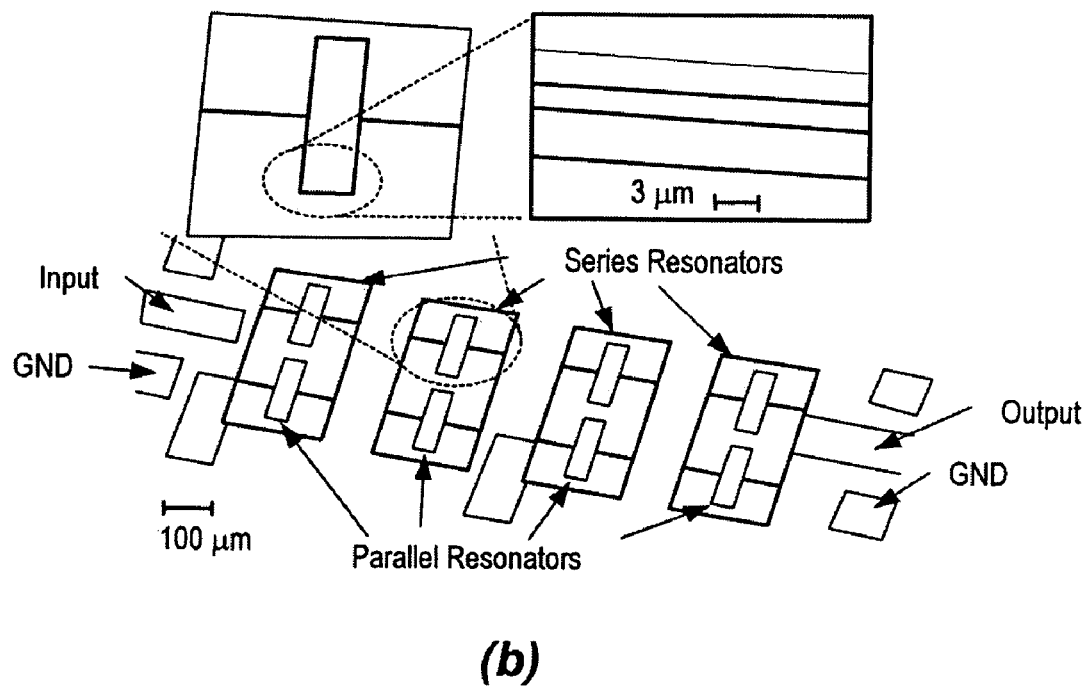

FIG. 10(*a*) shows SEM images showing a ladder filter made using ring-shaped micromechanical resonators in accordance with the embodiments of the present invention. FIG. 10(*a*) shows a SEM view of a ladder filter made from eight electrically cascaded ring-shaped resonators and a detailed view of the ring and the lithographically defined variation in the bottom electrode width used to tune the center frequency of the series resonators. FIG. 10(*b*) shows SEM images of a ladder filter made using rectangular-shaped micromechanical resonators in accordance with the embodiments of the present invention. FIG. 10(*b*) shows a SEM view of a ladder filter made from eight electrically cascaded rectangular plate resonators and a detailed view of the single rectangular resonator and the lithographically defined variation in the bottom electrode length used to tune the center frequency of the series resonators.

An alternate method for achieving the frequency shift is by changing the dimensions of the inner radius of the rings. By having a ring in the shunt branch with a diameter larger than the one in the series branch, the resonance frequency of the resonators in the shunt branch can be lowered, while increasing the out-of-band rejection.

Experimental Results—Filters

The fabricated micromechanical filters were tested in a RF probe station at atmospheric pressure. Ground-Signal-Ground (GSG) probes were used. Two-port S-parameter calibration (SOLT) was performed using short, open and through reference structures directly fabricated on the die under test, whereas a 50Ω resistor on a ceramic substrate was used as a load reference. Full S-parameter matrices were extracted for each filter using an Agilent E5071B network analyzer. No external terminations were connected to the device under test. The network analyzer is used to automatically change the terminations and compute the filter transmission spectrum.

Eight rings, all with an inner radius of 90 µm and 20 µm width, were electrically cascaded in a ladder structure. The frequency of the series and shunt branches were shifted by ~0.3%. This filter showed fairly moderate insertion losses of −7.9 dB at 236.2 MHz, an out-of-band rejection of 26 dB and a 20 dB shape factor of 2.79. The filter does not suffer from any other spurious resonance. As described above, the frequency shift was also defined by changing the size of the inner radius of the rings in the shunt branch (inner radius of 140 µm was used in the shunt branch and 90 µm in the series branch). Up to six rings were connected in this configuration.

Four, six and eight 200 μm long and 50 μm wide rectangular plates were tested in a ladder configuration as well. Again, the frequencies were shifted by about 0.3%. Insertion losses as low as −4 dB were recorded at 93.2 MHz; out-of-band rejection of 27 dB were achieved. The results showed that a second band pass filter exists due to the length-extensional mode shape present in the plate. This mode may be pushed further down in frequency by changing the aspect ratio of the microstructures. The results for four and six rectangular resonant filters are summarized in Table I.

TABLE I

Response parameters of band pass filters built using rectangular plate resonators.

| Number of Resonators | $f_c$ [MHz] | $BW_{3dB}$ [kHz] | I.L. [dB] | 20 dB S.F. | $R_{term}$ [kΩ] |
|---|---|---|---|---|---|
| 4 | 93.5 | 456 | −2 | N.A. | 1.5 |
| 6 | 93.1 | 332 | −4.7 | 2.7 | 2 |

In addition to the L network arrangement for the ladder filter formed by electrically cascading a network of resonators, other network arrangements, including Pi, T, L, or a lattice network configurations may be used. Furthermore, filter networks may be a part of a band pass filter circuit formed using a series of either of the Pi, T or L networks.

The examples of the filter circuits in accordance with the embodiments of the present invention show that using a novel and disruptive MEMS resonator technology based on the excitation of contour mode shapes in AlN microstructures, band pass filters at 93 and 236 MHz were produced, by electrically cascading up to eight resonators in a ladder structure. These filters showed a good performance, being characterized by low insertion losses (4 dB at 93 MHz), large close-in and out-of-band rejection (~40 dB and ~27 dB, respectively, for a 93 MHz filter) and fairly sharp roll-off with a 20 dB shape factor of ~2.2. The filters produced in accordance with the embodiments of the present invention are approximately 30 times smaller than existing SAW technology, commonly used in the IF bands for cell phones. In addition, with a temperature coefficient of −25 ppm/° C., they have 40% lower temperature sensitivity than SAW filters.

Figure 11:
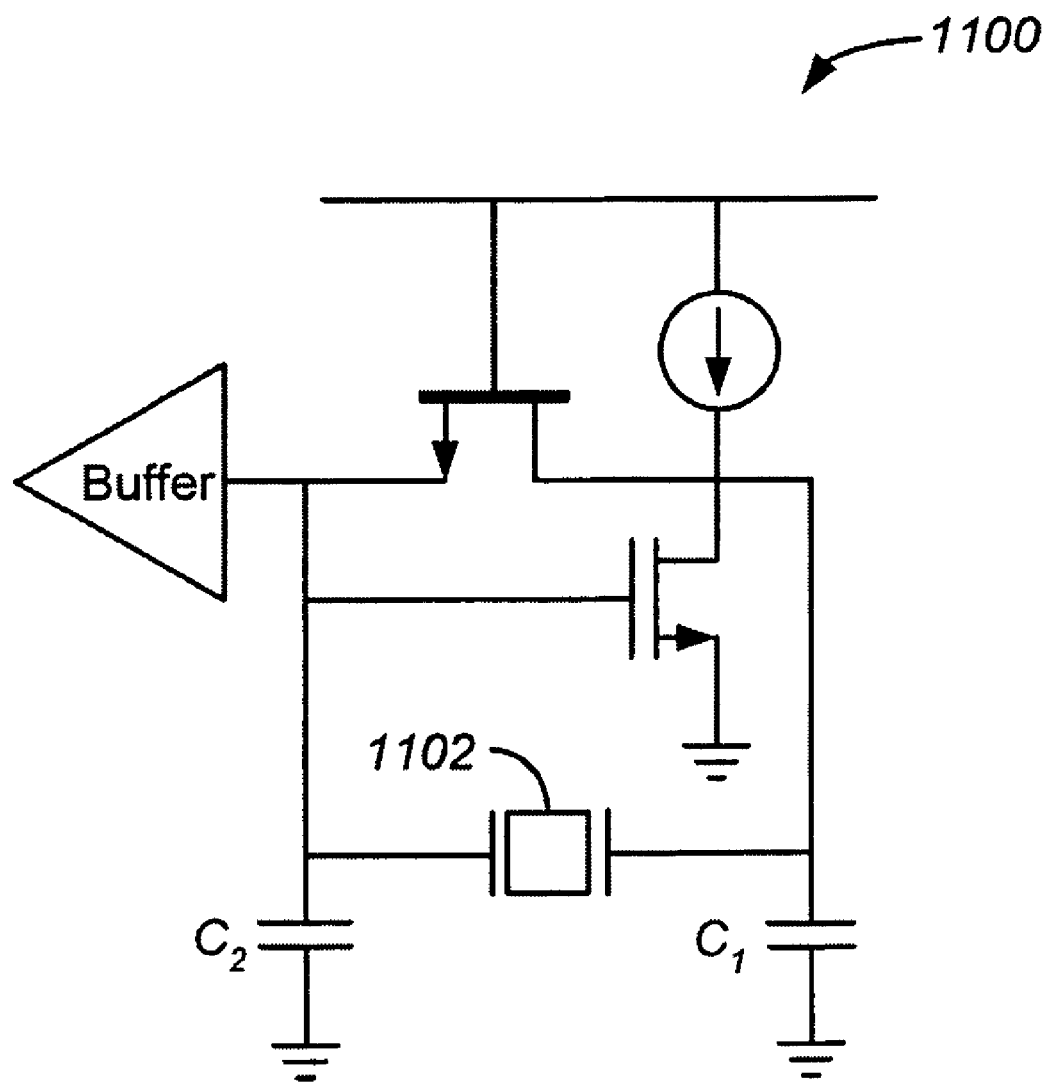
FIG. 11 is an exemplary oscillator circuit diagram that may be configured to include a contour-mode micromechanical resonator in accordance with the embodiments of the present invention.

The MEMS resonator technology based on the excitation of contour mode shapes in piezoelectric microstructures in accordance with the embodiments of the present invention may be used to form filter circuits such as those described above. In addition, the contour-mode piezoelectric resonators in accordance with the embodiments of the present invention may also be used as part of other circuits, such as, for example, an oscillator circuit (e.g., a Pi-network). FIG. 11 is an exemplary oscillator circuit 1100 diagram that may be configured to include a contour-mode micromechanical resonator 1102 in accordance with the embodiments of the present invention.

In addition to the resonator embodiments described above, an alternative resonator embodiment includes an interleaved electrode made of a metal layer that is interleaved between the top and bottom electrode. This interleaved metal layer is configured for use as a ground electrode, a mass loading element or as a means for applying a potential. The interleaved electrode can be made from a material including aluminum, platinum, tungsten, molybdenum, ruthenium, chromium, gold, titanium, doped polycrystalline silicon, and combinations thereof.

Figure 12:
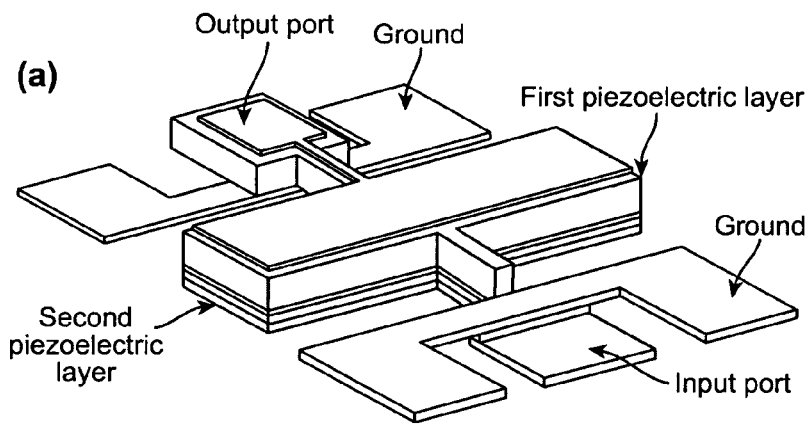
FIG. 12 is an exemplary diagram of a two-port stacked contour mode micromechanical resonator configured for vibrating in a contour-mode, in accordance with one embodiment of the present invention.

FIG. 12 is an exemplary diagrams of a two-port stacked contour mode micromechanical resonator configured for vibrating in a contour-mode, in accordance with one embodiment of the present invention.

FIG. 12 shows a schematic representation of a two-port stacked contour-mode AlN piezoelectric resonator. The device can be formed by two aluminum nitride layers, each sandwiched between two electrodes (platinum or aluminum) and can vibrate in a contour mode shape. A vertical electric field can be applied to one of the two layers to induce in plane dilation of the plate through the $d_{31}$ piezoelectric coefficient. The rectangular plate can be excited into two fundamental modes, either a length-extensional or a width-extensional mode, being the center frequency set either by the width or length of the plate, respectively. At resonance, the large strain induced in the plate produces a charge that can be piezoelectrically sensed by the other layer. The two-port topology permits the physical separation of the input electrode from the output electrode, therefore reducing parasitic feed through. In this device because the overall surface of the plate is electroded, a maximum electromechanical coupling can be achieved. By moving from a horizontal two-port configuration to a vertical two-port topology the direct feed through that is experienced through the device [e.g., see G. Piazza, et al., *Hilton Head Workshop*, pp. 38-41, June 2004] and that would have been extremely problematic at very high frequencies can be eliminated or reduced.

Figure 13:
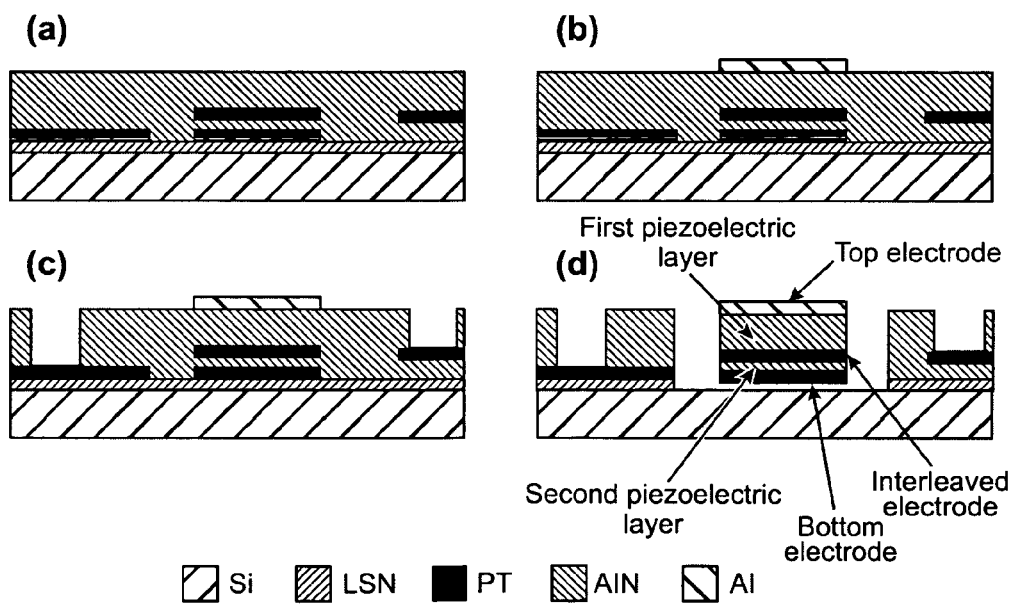
FIGS. 13(a)-(d) are exemplary diagrams of one embodiment of the fabrication process for the contour mode resonator of FIG. 12.
Figure 14:
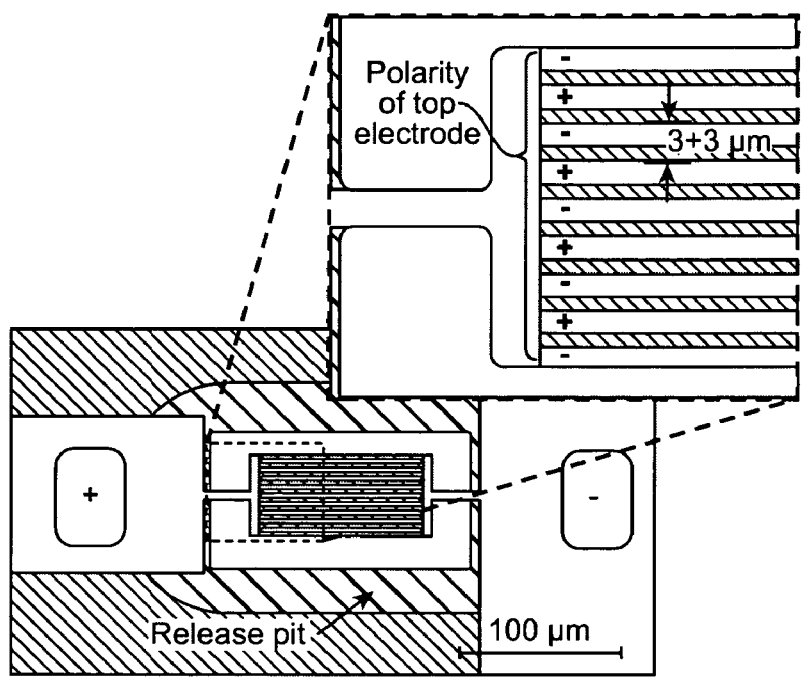
FIG. 14 is an optical micrograph of micromechanical resonator with selectively patterned half-wavelength period electrodes.

FIGS. 13(*a*)-(*d*) are exemplary diagrams of one embodiment of the fabrication process for the contour mode resonator of FIG. 12. As is shown in FIG. 13(*a*) Low-stress nitride (LSN) is used for isolation purpose; on top of it Pt is patterned by lift off; a thin layer of AlN is sputter deposited; afterwards the second Pt electrode is patterned by lift off and a thicker AlN layer is sputtered deposit to form the second structural layer. In FIG. 13(*b*) The Al top electrode is sputter-deposited and patterned by dry etch in a $Cl_2$-based RIE system. In FIG. 13(*c*) contacts to the bottom and intermediate electrode are opened by wet etch of AlN in hot $H_3PO_4$. In FIG. 14(*d*) AlN is masked by low-temperature oxide (LTO) and dry etched in a $Cl_2$-based RIE system. LTO and LSN are then etched and removed by dry etch. The final structure is dry released in $XeF_2$. Alternatively, the structures can be released by a wet etching process. For the intermediate Pt electrode a lift off process was performed with the attention to use an ion-free developer that would not attack the AlN films. All the steps involved in the fabrication process occur at low temperature ($T_{max}$<400° C.), therefore making these micro devices potentially post-CMOS compatible. Also, this two-layer structure requires two subsequent depositions of AlN films. Highly polycrystalline AlN piezoelectric films were sputtered-deposited using an AMS single module tool and showed a good rocking curve values of ~1.3°.

Another aspect of the embodiments of the present invention is directed towards the patterning of the electrodes and the effects of those patterned electrodes on the contour mode vibrations of the resonators. For example, in the resonators the portions that are used for applying an alternating electric field include electrical interconnects between a patterned region or regions of the top electrode and a patterned region or regions of the bottom electrode. In accordance with this aspect, a novel design for piezoelectric contour mode MEMS plate resonators is provided that effectively uncouples the resonant frequency of the devices from their overall dimensions by selectively patterning the transduction electrodes and routing the excitation waveform as seen in FIG. 14. FIG. 14 shows an optical micrograph of micromechanical resonator with selectively patterned half-wavelength period electrodes. The polarity of the electric excitation signal alternates between adjacent top and bottom electrode pairs. The effective characteristic lengths for determining frequency and motional resistance are 6 and 900 μm, respectively. The ability to scale the lateral dimensions of the structural material enables more mechanically robust devices that are capable of attaining higher frequencies with reduced motional resistances (e.g., 24Ω) and relaxed fabrication tolerances (structural plate measures 51×100 μm). The electrode configuration can also suppress the appearance of any lower or sub-harmonic modes in the frequency response of the device.

Figure 15:
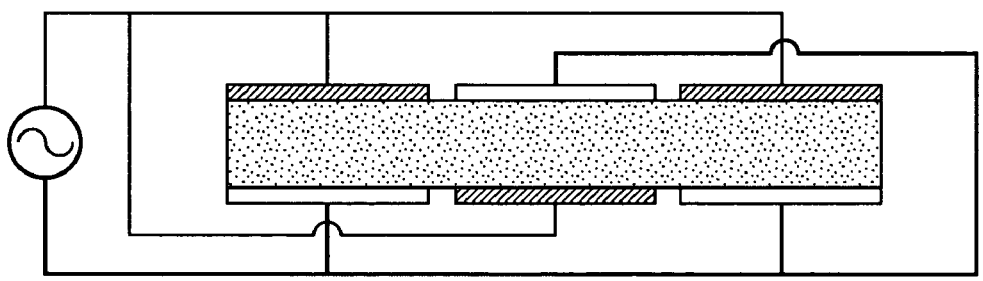
FIG. 15 is a schematic of a resonator cross-section showing selective electrode patterning and signal routing.

In the patterned electrode embodiment, the frequency determining dimension is effectively uncoupled from the overall dimensions of the AlN plate by patterning the transduction electrodes such that the polarity of the excitation electric field alternates at half-wavelength intervals in the direction of wave propagation as seen in FIG. 15. FIG. 15 shows a schematic of resonator cross-section showing selective electrode patterning and signal routing. The polarity of each top and bottom electrode pair alternates at half-wavelength intervals. The period of the electrode pairs determines the operating frequency of the resonator while the number of periods affects its motional resistance. The polarity of the electrodes uniquely matches that of the strain field for a specific bulk mode of vibration of the plate. Moreover, the number of half-wavelength electrodes can be scaled to engineer a proportional decrease in motional resistance (the motional resistance also depends on the length of the plate).

A practical implication of this aspect is that half-wavelength features need only be defined in the thin metal electrodes, and the feasibility of fabricating such features in a production environment has essentially been proven by SAW device manufacturers (in fact SAW devices have more demanding fabrication requirements due to their lower acoustic wavespeed). As with SAW devices, the nominal frequency of the resonator depends not only on the absolute dimensions but also the periodicity of the electrodes.

All publications, and descriptions mentioned above are herein incorporated by reference in their entirety for all purposes. None is admitted to be prior art.

As will be understood by those skilled in the art, the present invention may be embodied in other specific forms without departing from the essential characteristics thereof. For example, the geometry or materials for the top and the bottom electrodes may be the same or different, and either one may be produced from aluminum, platinum, tungsten, molybdenum, ruthenium, chrome, gold, titanium doped polycrystalline silicon, and combinations thereof. These other embodiments are intended to be included within the scope of the present invention, which is set forth in the following claims.

What is claimed is:

1. A laterally vibrating stacked micromechanical piezoelectric resonator, comprising:
   a top electrode;
   an interleaved electrode;
   a first piezoelectric layer disposed between the top electrode and the interleaved electrode;
   a bottom electrode;
   a second piezoelectric layer disposed between the interleaved electrode and the bottom electrode;
   said interleaved electrode in contact with said first and said second piezoelectric layers,
   said first and second piezoelectric layers each having a planar surface having a cantilevered periphery, dimensioned to undergo in-plane lateral displacement at said periphery; and
   means for applying an alternating electric field across the thickness of at least one of said first and second piezoelectric layers, said electric field configured to cause said at least one piezoelectric layer to have an in-plane lateral displacement that is substantially in the plane of said planar surface.

2. The resonator of claim 1 wherein said means for applying an alternating electric field comprise electrical interconnects to the top electrode and the bottom electrode.

3. The resonator of claim 1 wherein said bottom electrode is lithographically patterned to excite a specific region or regions of the piezoelectric resonator.

4. The resonator of claim 1 wherein said top electrode is lithographically patterned to excite a specific region or regions of the piezoelectric resonator.

5. The resonator of claim 1 wherein said first or said second piezoelectric layer is a layer selected from the group consisting of aluminum nitride, gallium nitride, aluminum gallium arsenide, zinc oxide, quartz, zinc-sulfide, cadmium-sulfide, lithium tantalate, lithium niobate, and other members of the lead lanthanum zirconate titanate family, and combinations thereof.

6. The resonator of claim 1 wherein said bottom, said interleaved, or said top electrode is made from a material selected from the group consisting of aluminum, platinum, tungsten, molybdenum, ruthenium, chrome, gold, titanium, doped polycrystalline silicon, niobium, copper, silver, tantalum, cobalt, nickel, palladium, silicon germanium, doped conductive zinc oxide, and combinations thereof.

7. The resonator of claim 1 comprising one or more tethers that anchor the resonator to a substrate or other resonators.

8. The resonator of claim 7 being a part of an array of resonators formed by mechanically coupling the resonators in said array to one another using said tethers.

9. The resonator of claim 7 wherein said one or more tethers are configured for use as electrical connectors for exchanging electrical signals with the piezoelectric resonator.

10. The resonator of claim 9 being one of more than one resonator and wherein said more than one resonators are electrically cascaded to form a network of said resonators.

11. The resonator of claim 10 wherein said network is a Pi, T, L or a lattice network.

12. The resonator of claim 11 being a part of a band pass filter circuit formed using a series of either of said Pi, T or L networks.

13. The resonator of claim 11 comprising 2 or more resonators that are electrically connected.

14. The resonator of claim 11 comprising electrical connectors used to route the signal from one resonator to the next.

15. The resonator of claim 1 being one of more than one resonator and wherein said more than one resonators are connected and arranged as a band-pass filter circuit.

16. The resonator of claim 1 comprising
   means for applying a DC voltage across the thickness of the piezoelectric resonator, said DC voltage configured for tuning the center frequency of the resonator.

17. The resonator of claim 1 wherein said piezoelectric resonator is a part of a frequency reference in an oscillator circuit.

18. The resonator of claim 1 wherein said piezoelectric resonator is a part of a band pass filter circuit.

19. The resonator of claim 1 wherein said first or said second piezoelectric layer has a shape selected from the group consisting of a rectangle, a circle, a polygon, a circular annulus, a rectangular annulus, a polygonal annulus and combinations thereof.

20. The resonator of claim 1 comprising means for sensing the alternating electric field across the thickness of at least one of said first and second piezoelectric layers, said means for sensing configured to detect the at least one of first and second piezoelectric layers vibrating in the in-plane lateral displacement.

21. The resonator of claim 1 wherein the interleaved electrode is a metal layer configured for use as a ground electrode, a mass loading element or as a means for applying a potential.

22. The resonator of claim 1 wherein said interleaved electrode is made from a material selected from the group consisting of aluminum, platinum, tungsten, molybdenum, ruthenium, chrome, gold, titanium, doped polycrystalline silicon, and combinations thereof.

23. The resonator of claim 1 wherein said means for applying an alternating electric field comprise electrical interconnects between a patterned region or regions of the top electrode and a patterned region or regions of the bottom electrode.

* * * * *